United States Patent
Kato et al.

(10) Patent No.: US 9,601,370 B2
(45) Date of Patent: Mar. 21, 2017

(54) NONVOLATILE SEMICONDUCTOR MEMORY DEVICE AND METHOD OF MANUFACTURING THE SAME

(71) Applicant: KABUSHIKI KAISHA TOSHIBA, Minato-ku (JP)

(72) Inventors: Hisashi Kato, Mie (JP); Murato Kawai, Yokkaichi (JP); Toru Matsuda, Yokkaichi (JP); Takeshi Sonehara, Yokkaichi (JP); Katsumi Iyanagi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/645,985

(22) Filed: Mar. 12, 2015

(65) Prior Publication Data

US 2016/0079185 A1    Mar. 17, 2016

Related U.S. Application Data

(60) Provisional application No. 62/049,761, filed on Sep. 12, 2014.

(51) Int. Cl.
*H01L 27/115* (2006.01)
*H01L 23/528* (2006.01)
(Continued)

(52) U.S. Cl.
CPC .. *H01L 21/76877* (2013.01); *H01L 21/76816* (2013.01); *H01L 21/76838* (2013.01);
(Continued)

(58) Field of Classification Search
CPC . H01L 23/562; H01L 23/5226; H01L 23/528; H01L 27/11578; H01L 21/76802; H01L 21/76843; H01L 21/76877
See application file for complete search history.

(56) References Cited

U.S. PATENT DOCUMENTS 7,799,672 B2   9/2010   Hashimoto et al.
7,847,334 B2   12/2010   Katsumata et al.
(Continued)

FOREIGN PATENT DOCUMENTS

| JP | 2010-192646 A | 9/2010 |
|----|---------------|--------|
| JP | 4691124 B2    | 6/2011 |
| JP | 2012-151187 A | 8/2012 |

OTHER PUBLICATIONS

U.S. Appl. No. 14/849,772, filed Sep. 10, 2015, Ichinose.

*Primary Examiner* — Christine Enad

(74) *Attorney, Agent, or Firm* — Oblon, McClelland, Maier & Neustadt, L.L.P.

(57) ABSTRACT

The memory cell array includes a memory string and a select transistor. The memory string includes plural memory cells connected in series, the memory string being formed to extend in a first direction as a lengthwise direction. The select transistor is connected to one end of the memory string. In the wiring section, a conductive layer and an interlayer insulating layer are laminated alternately to form plural layers. The conductive layer functions as a gate electrode of the memory cells and the select transistor. One select transistor includes plural conductive layers, and the plural conductive layers are connected in common by a common first contact. The plurality of the conductive layers and the first contact include a barrier metal formed in a periphery thereof. The plurality of the conductive layers and the first contact are in contact without the barrier metal therebetween at a boundary thereof.

12 Claims, 23 Drawing Sheets

(51) Int. Cl.
*H01L 21/768* (2006.01)
*H01L 23/522* (2006.01)

(52) U.S. Cl.
CPC .... *H01L 23/5226* (2013.01); *H01L 27/11565* (2013.01); *H01L 27/11575* (2013.01); *H01L 27/11582* (2013.01)

(56) References Cited

U.S. PATENT DOCUMENTS

| | | |
|---|---|---|
| 7,927,926 B2 | 4/2011 | Katsumata et al. |
| 8,435,857 B2 | 5/2013 | Kiyotoshi |
| 2008/0173932 A1* | 7/2008 | Kidoh ............... H01L 27/11568 257/324 |
| 2010/0213526 A1* | 8/2010 | Wada ................ H01L 21/76808 257/314 |
| 2013/0089974 A1 | 4/2013 | Lee et al. |
| 2015/0340316 A1* | 11/2015 | Or-Bach ................ G11C 5/025 257/2 |
| 2016/0093626 A1* | 3/2016 | Izumi .................. H01L 27/1157 257/324 |

\* cited by examiner

NONVOLATILE SEMICONDUCTOR MEMORY DEVICE AND METHOD OF MANUFACTURING THE SAME

CROSS REFERENCE TO RELATED APPLICATIONS

This application is based on and claims the benefit of priority from prior U.S. Provisional Patent Application No. 62/049,761, filed on Sep. 12, 2014, the entire contents of which are incorporated herein by reference.

FIELD

Embodiments described herein relate to a nonvolatile semiconductor memory device and a method of manufacturing the same.

BACKGROUND

In recent years, in the field of NAND type flash memory, NAND type flash memory devices of laminating type (three-dimensional type) are attracting attention, as devices enabled to achieve high integration without resolution limit of lithography technologies.

Such NAND type flash memory devices of three-dimensional type comprise a stacked body configured by alternately stacking conductive films which function as word lines or select gate lines and interlayer insulating films. In addition, It also comprises semiconductor layers formed to penetrate the stacked body. These semiconductor layers function as bodies of the memory strings. A memory film including a charge storage film is formed between the semiconductor layer and the conductive films.

In such NAND type flash memory devices of three-dimensional type, ON/OFF properties of the select transistors (selection characteristics) are important. It is necessary to flow a sufficient current when it is selected, while it is necessary to suppress a leak current when it is not selected. On the other hand, in the NAND flash memory of a three-dimensional type, an area of a wiring region for connection to various wiring lines is required to be reduced.

DETAILED DESCRIPTION

The nonvolatile semiconductor memory device according to embodiments described hereinbelow includes a memory cell array and a wiring section. The memory cell array includes a memory string and a select transistor. The memory string includes a plurality of memory cells connected in series, the memory string being formed to extend in a first direction. The select transistor is connected to one end of the memory string. In the wiring section, a conductive layer and an interlayer insulating layer are laminated alternately to form plural layers. The conductive layer functions as a gate electrode of the memory cells and the select transistor. One select transistor includes the plurality of the conductive layers, and the plurality of the conductive layers are connected in common by a common first contact. The plurality of the conductive layers and the first contact include a barrier metal formed in a periphery thereof. The plurality of the conductive layers and the first contact without the barrier metal therebetween at a boundary thereof.

Next, a nonvolatile semiconductor memory device according to an embodiment will be described with reference to the drawings in detail. Note that these embodiments are mere examples, and are not shown for limiting the scope of the present invention. For example, the nonvolatile semiconductor memory device described hereinbelow has a structure in which a memory string extends in a straight line along a vertical direction to a substrate, but the present invention is applicable to a device in which a memory string has a U-shaped form in which the memory string is folded back in an opposite direction on the way. In addition, each of the drawings of the nonvolatile semiconductor memory device used in the following embodiments are schematic ones. The thickness, width, ratio and the like of the layers are different from actual ones.

The embodiment described hereinbelow relates to a nonvolatile semiconductor memory device having a structure in which a plurality of MONOS (Metal-Oxide-Nitride-Oxide-Semiconductor) type memory cells (transistors) are provided in a height direction. The MONOS type memory cells includes a semiconductor film as a channel provided in a pillar shape that is perpendicular to the substrate, and a gate electrode film provided on a side surface of the semiconductor film via a charge storage layer. However, these embodiments are not intended to limit the scope of the present invention. The embodiments may be applicable to memory cells having another types of charge storage layer, e.g., SONOS-type (Semiconductor-Oxide-Nitride-Oxide-Semiconductor) memory cell, or memory cells of a floating-gate type.

First Embodiment

Figure 1:
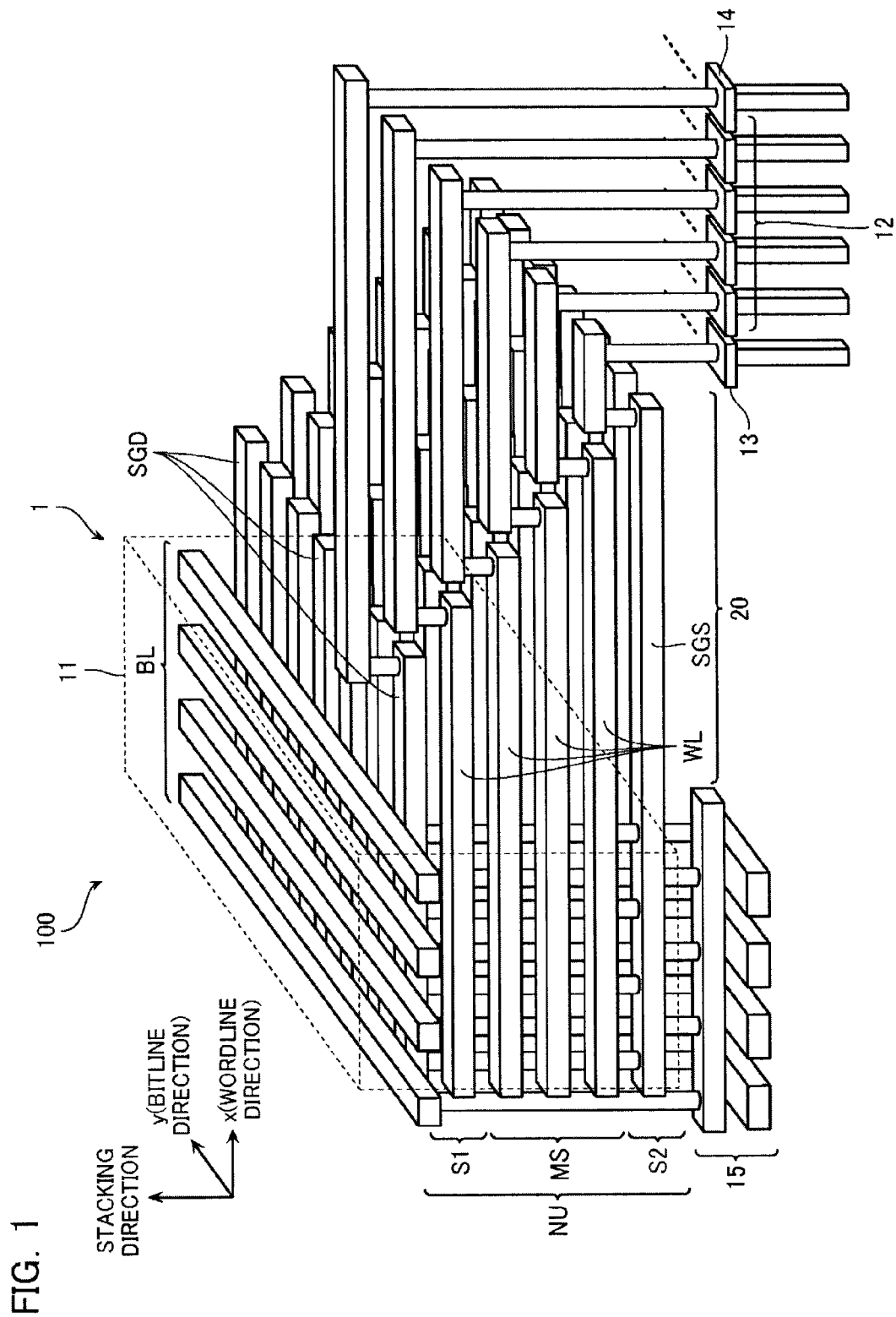
FIG. 1 is a perspective view schematically illustrating one example of a structure of a nonvolatile semiconductor memory device 100 according to the first embodiment.

FIG. 1 is a perspective view schematically illustrating an example of a structure of a nonvolatile semiconductor memory device 100 according to the first embodiment. The nonvolatile semiconductor memory device 100 includes a memory cell array 11, a word line driver circuit 12, a source-side select gate line drive circuit 13, a drain-side select gate line drive circuit 14, a sense amplifier 15, word lines WL, source-side select gate lines SGS, drain-side select gate lines SGD, bit lines BL, word-line wiring regions, and the like.

The memory cell array 11 includes, on a semiconductor substrate (not illustrated in FIG. 1), a memory string MS in which a plurality of memory cells MC (memory transistor) are serially connected, a drain-side select transistor S1 and a source-side select transistor S2 which are connected to both ends of the memory string MS, respectively. Note that the memory string MS, the drain-side select transistor S1 and the source-side select transistor S2 that are connected to both ends thereof is hereinafter referred to as "NAND cell unit NU".

As described below, the memory cell MC has a structure in which a control gate electrode (word line) is provided on a side surface of a columnar-shaped semiconductor film functioning as a channel, via a memory film including the charge storage layer.

The drain-side select transistor and source-side select transistor each have a structure in which a select gate electrode (select gate line) is provided on a side surface of a columnar-shaped semiconductor film, via a memory film including the charge storage layer. FIG. 1 exemplifies, for simplification of illustration, a case where four memory cells MC are provided in one memory string MS. It goes without saying that the number of memory cells MC in one memory string MS is not limited to this example.

The word lines WL are connected in common to the memory cells adjoining in the X direction (word-line direction) in FIG. 1. In addition, the source-side select gate line SGS is connected in common to the source-side select transistors S2 adjoining in the word-line direction. The drain-side select gate line SGD is connected in common to the drain-side select transistors S1 adjoining in the word-line direction. Note that the source-side select gate line SGS and the drain-side select gate line SGD may be collectively and merely called "a select gate line" in the later explanation. In addition, a source-side select transistor and a drain-side select transistor may be collectively and merely named "a select transistor". Note that, among the memory cells MC in the memory string MS, one or more memory cells MC adjacent to the source-side select gate line SGS and the drain-side select gate line SGD may be dealt as dummy cells which are not used for storing data.

Although the examples described below explain examples in which each of the both ends of the memory string MS is provided with one dummy cell, respectively, it does not mean that the scope of the present invention is limited to these examples. The dummy cells may be two or more, or it is possible to omit the dummy cells.

In addition, the bit lines BL are arranged to extend along the Y direction (bit-line direction) that is a lengthwise direction and intersects the X direction (word-line direction). Also, the bit lines BL are arranged with a certain pitch in the X direction. The bit lines BL are connected to a plurality of the memory string MS via the drain-side select transistors S1. Although the illustration of the source line SL is omitted in FIG. 1, the source line SL is arranged having the Y direction as its lengthwise direction, and is connected to the memory string MS via the source-side select transistor S2.

A word line driver circuit 12 is a circuit that controls the voltages applied to the word lines WL. A source-side select gate line drive circuit 13 is a circuit that controls the voltages applied to the source-side select gate lines SGS. A drain-side select gate line drive circuit 14 is a circuit that controls the voltages applied to the drain-side select gate lines SGD. In addition, a sense amplifier 15 is a circuit that amplifies a signal (a voltage) read to the bit lines BL from selected memory cells.

A wiring section 20 is a wiring section that connects the word lines WL and the select gate lines SGD, SGS to contacts. The word line WL and the select gate lines SGS, SGD have structures processed in the shape of stairs so as to be connected to the contacts independently at their upper parts thereof, respectively.

Figure 2:
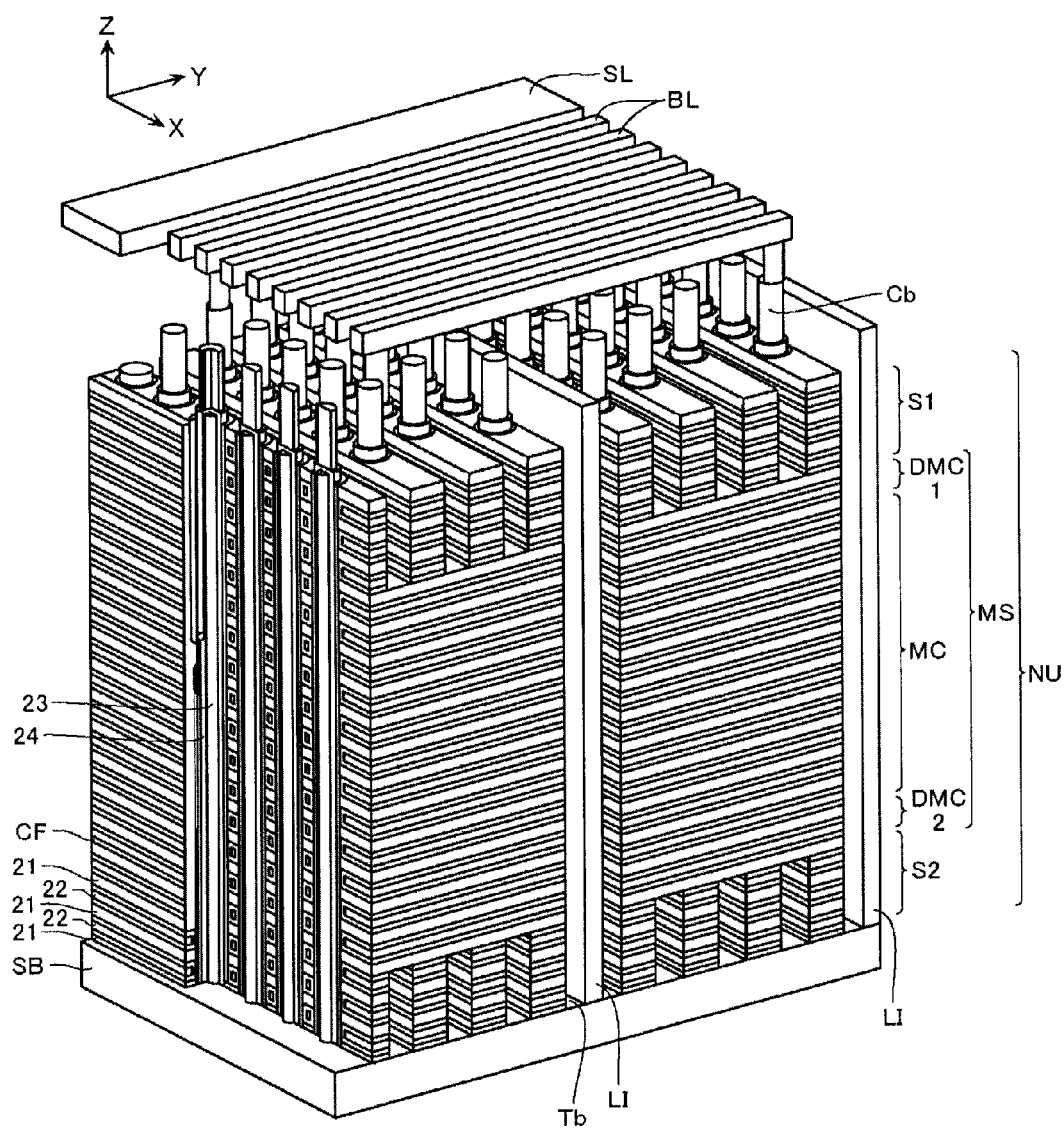
FIG. 2 is a perspective view illustrating a part of a structure of the memory cell array 11.
Figure 3:
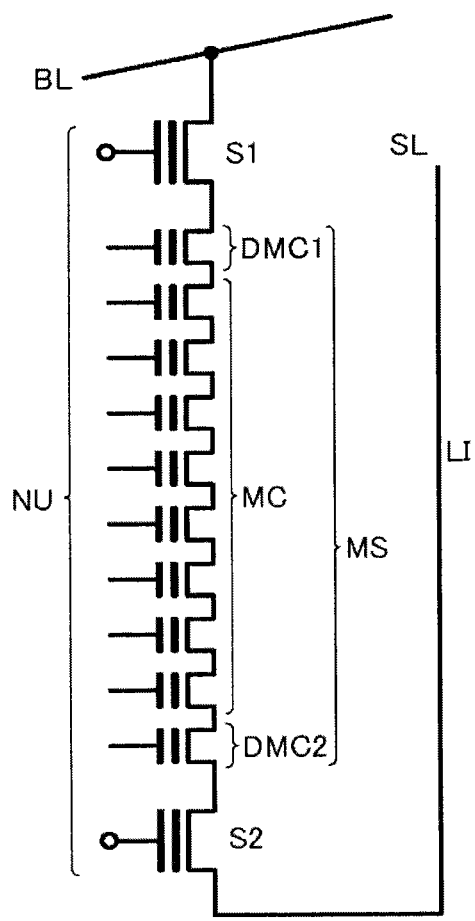
FIG. 3 is an equivalent circuit diagram of one NAND cell unit NU.
Figure 4A:
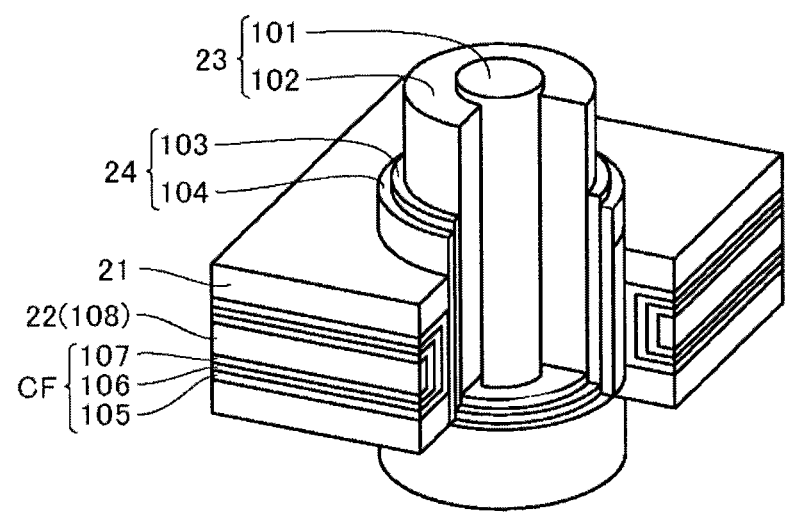
FIG. 4A is a perspective sectional view of one memory cell MC.
Figure 4B:
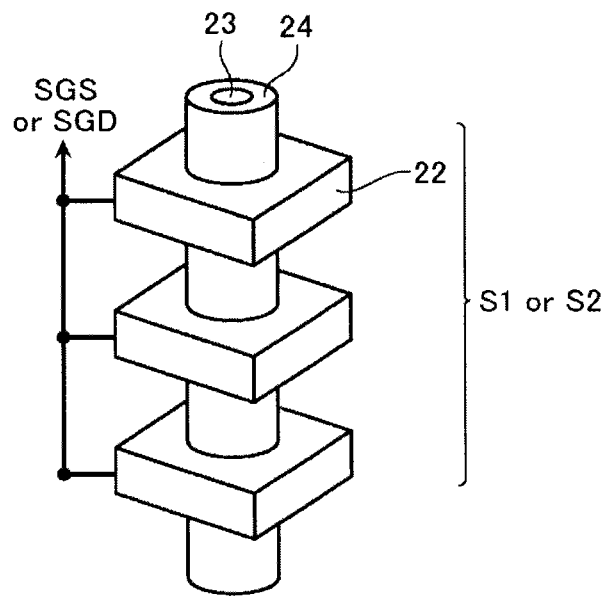
FIG. 4B is a schematic perspective view of one drain-side select transistor S1 or source-side select transistor S2.

Next, the details of the structure of the memory cell array 11 will be described with reference to FIG. 2 to FIG. 4B. FIG. 2 is a perspective view illustrating a part of the structure of the memory cell array 11. FIG. 3 is an equivalent circuit diagram of one NAND cell unit NU. FIG. 4A is a perspective sectional view of one memory cell MC or the like, and FIG. 4B is also a schematic perspective diagram of one drain-side select transistor S1 or source-side select transistor S2.

As shown in FIG. 2, the memory cell array 11 has a structure in which interlayer insulating layers 21 and conductive films 22 are alternately stacked on a semiconductor substrate SB. These conductive films 22 function as control gates (word lines WL) of the memory cells MC, the source-side select gate lines SGS and the drain-side select gate lines SGD. The interlayer insulating layers 21 are arranged above and below these conductive films 22 to insulate the conductive films 22 from one another.

The conductive films 22 may be formed, for example, by tungsten (W), tungsten nitride (WN), tungsten silicide ($WSi_x$), tantalum (Ta), tantalum nitride (TaN), tantalum silicide (TaSix), palladium silicide ($PdSi_x$), erbium silicide ($ErSi_x$), yttrium silicide ($YSi_x$), platinum silicide ($PtSi_x$), hafnium silicide (HfSi$_x$), nickel silicide (NiSi$_x$), cobalt silicide (CoSi$_x$), titanium silicide (TiSi$_x$), vanadium silicide (VSi$_x$), chromium silicide (CrSi$_x$), manganese silicide (MnSi$_x$), iron silicide (FeSi$_x$), ruthenium (Ru), molybdenum (Mo), titanium (Ti), titanium nitride (TiN), vanadium (V), chromium (Cr) manganese (Mn), iron (Fe), cobalt (Co), nickel (Ni), gold (Au), silver (Ag), copper (Cu), or the compound of these materials. They may be formed of polysilicon doped with impurities.

Formed in the periphery of the conductive films 22 is a laminated film CF including a block insulating film 105, a block high-k dielectric film 106 and a barrier metal 107. This will be described later.

Also, semiconductor layers 23 are arranged having a stacking direction (Z direction) as their lengthwise direction, and arranged in certain pitches in the XY plane, so as to penetrate a stack of such the interlayer insulating layers 21 and conductive films 22. Formed between the semiconductor layer 23 and the conductive film 22 and the interlayer insulating layer 21 is a memory film 24 including a charge storage layer. The memory film 24 may be formed of a laminated structure of a charge storage film such as a silicon nitride film, and an oxide film such as a silicon oxide film, as described below. A threshold voltage of the memory cell MC changes depending on the amount of electric charges stored in the charge storage film. The memory cell MC stores data corresponding to this threshold voltage.

The semiconductor layers 23 function as a channel region (body) of the memory cells MC, the dummy cells DMC1, DMC2 and the select transistors S1, S2 that are included in the NAND cell unit NU. These semiconductor layers 23 are connected to the bit lines BL via contacts Cb at their upper ends. The bit lines BL are arranged having the Y direction as their lengthwise direction, and arranged in a certain pitch in the X direction.

In addition, the lower ends of the semiconductor layers 23 are connected to the semiconductor substrate SB. As described below, the lower ends of the semiconductor layers 23 are connected to the source line SL via this semiconductor substrate SB and a source contact LI described below. The source line SL is arranged having the Y direction as its lengthwise direction, similar to the bit line BL.

Note that the stack of the interlayer insulating layers 21 and the conductive films 22 in the memory cell array 11 is divided into blocks each of which is the smallest unit for data erase. Trenches Tb are formed at the boundaries of the division. An interlayer insulating layer not illustrated is embedded in these trenches Tb. Furthermore, the above-described source contact LI is formed to penetrate the interlayer insulating layer. This source contact LI has a lower end connected to the semiconductor substrate SB, and an upper end connected to the source line SL.

FIG. 3 is an equivalent circuit diagram of one NAND cell unit NU. In this memory cell array 11, one NAND cell unit includes: the memory string MS having the plural memory cells MC, and the dummy cells DMC1,DMC2; the drain-side select transistor S1 connected between the upper end of the memory string MS and the bit line BL; and the source-side select transistor S2 connected between the lower end of the memory string and the source line SL. One example of the specific structures of the memory cell MC and dummy cell DMC are shown in FIG. 4A. The semiconductor layer 23 includes an oxide film core 101$a$, and a semiconductor pillar member 102 that surrounds the periphery of the oxide film core 101$a$. The oxide film core 101 is formed of a silicon oxide film (SiO$_2$), for example. The semiconductor pillar member 102 is formed of, for example, silicon (Si), silicon germanium (SiGe), silicon carbide (SiC), germanium (Ge) or carbon (C).

Formed around the semiconductor pillar member 102 is a tunnel insulating film 103 and a charge storage layer 104 that surround the semiconductor pillar member 102. The tunnel insulating film 103 is formed of a silicon oxide film (SiO$_x$), for example, and functions as a tunnel insulating film of the memory cell MC or the dummy cell DMC. The charge storage layer 104 is formed of a silicon nitride film (SiN), for example, and has a function of causing trap of electrons injected from the semiconductor pillar member 102 via the tunnel insulating film 103 due to a write operation. In this example, the tunnel insulating film 103 and the charge storage layer 104 are illustrated to be formed on the entire side surface of the semiconductor pillar member 102. However, they are not limited to this example. They may be formed only on the side surfaces of the word lines WL.

Stacked alternately on the side surface of the charge storage layer 104 are the above-mentioned interlayer insulating layers 21 and tungsten electrodes 108 functioning as the conductive film 22. However, formed around the tungsten electrode 108 are the block insulating film 105, the block high-k dielectric film 106 and the barrier metal 107. They surround the tungsten electrode 108 in this order from outside.

The block insulating film 105 may be formed of, for example, a silicon oxide film. In this example, the block insulating film 105 is formed to cover the periphery of the tungsten electrode 108. However, similarly to the tunnel insulating film 103 and the charge storage film 104, it can be formed on the entire side surface of the semiconductor pillar member 102.

Note that as the material of the tunnel insulating film 103 and the block insulating film 105, it is possible to adopt, in addition to a silicon oxide film (SiOx), Al$_2$O$_3$, Y$_2$O$_3$, La$_2$O$_3$, Gd$_2$O$_3$, Ce$_2$O$_3$, CeO$_2$, Ta$_2$O$_5$, HfO$_2$, ZrO$_2$, TiO$_2$, HfSiO, HfAlO, ZrSiO, ZrAlO, AlSiO and the like, for example.

FIG. 4B is a perspective diagram illustrating the structure of one drain-side select transistor S1 or source-side select transistor S2.

One drain-side select transistor S1 or source-side select transistor S2 comprises a plurality of the conductive films 22, the memory film 24 which are adjacent to the semiconductor layers 23 in the XY plane. The plural conductive films 22 connected to one select transistor S1 or S2 are short-circuited electrically by a contact (not illustrated in FIG. 4B) that penetrates these conductive films 22, thereby functioning as a single gate electrode. In this way, one select transistor S1 or S2 in this first embodiment comprises a plurality of short-circuited conductive films 22. Such structure is employed for improving selection characteristics of the select transistors S1 and S2. That is, it is necessary to suppress a leak current in unselected select transistors S1 and S2 as low as possible.

If it is not possible, a reading operation, write operation and erase operation cannot be performed properly, which leads to read error, write error erase error, and the like. It may also increase consumption of electric power. Having a plurality of conductive films 22 functioning as a single gate electrode in one select transistor S1 or S2, the selectivity of the select transistor improves.

Figure 5:
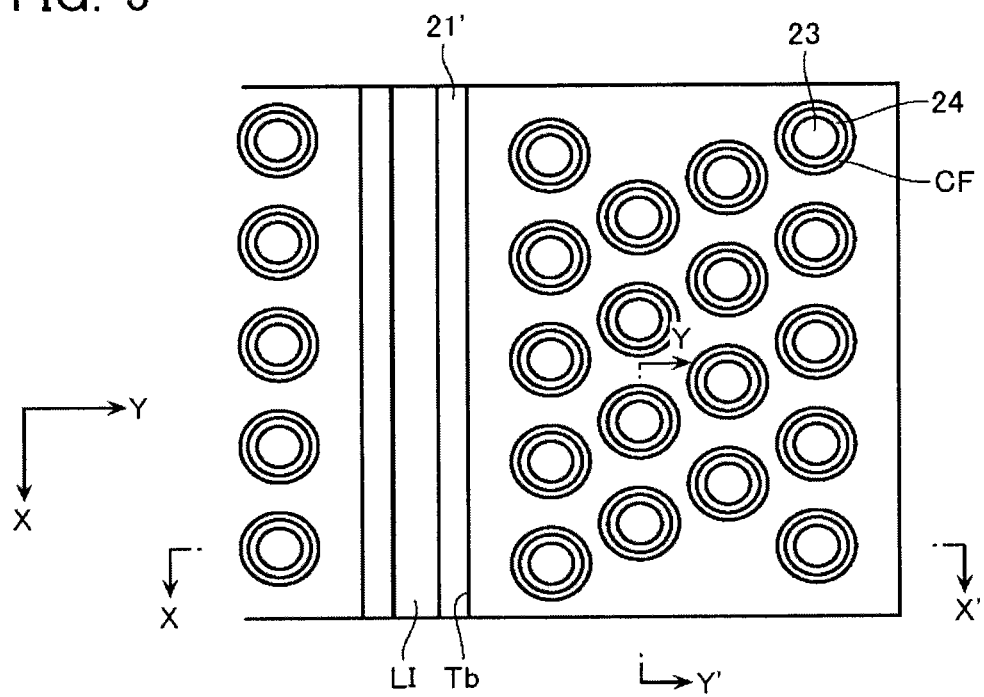
FIG. 5 is a plan view of a part of the memory cell array 11.
Figure 6:
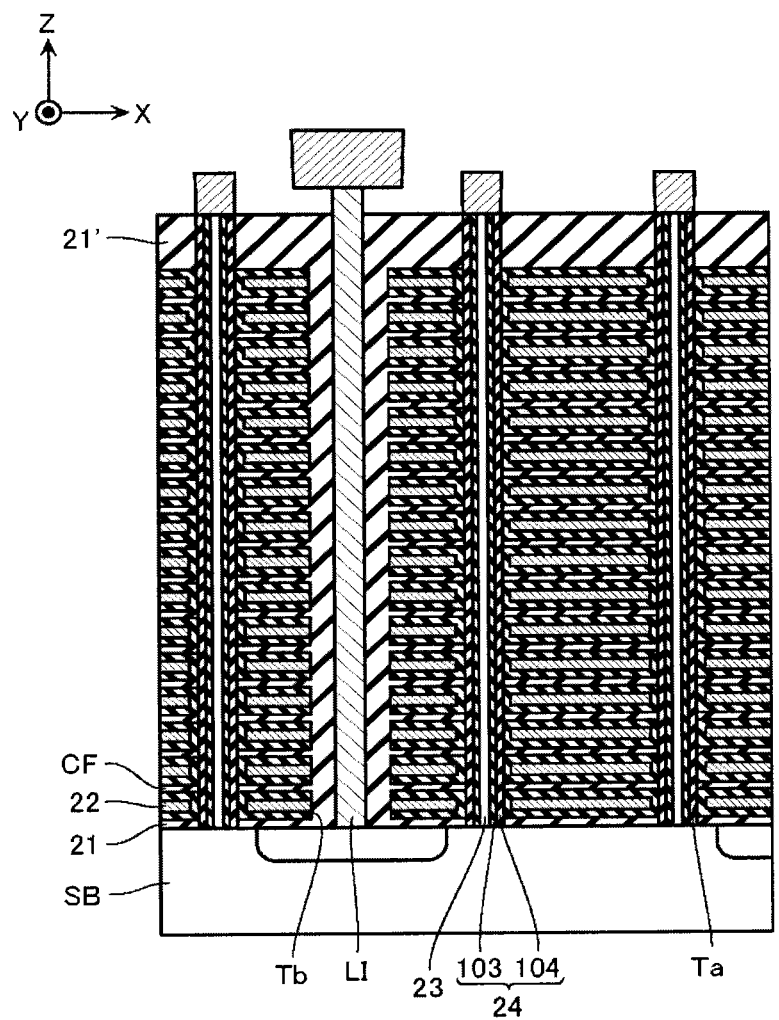
FIG. 6 is a sectional view along the Y direction of the memory cell array 11 (a sectional view of X-X' direction of FIG. 5).
Figure 7:
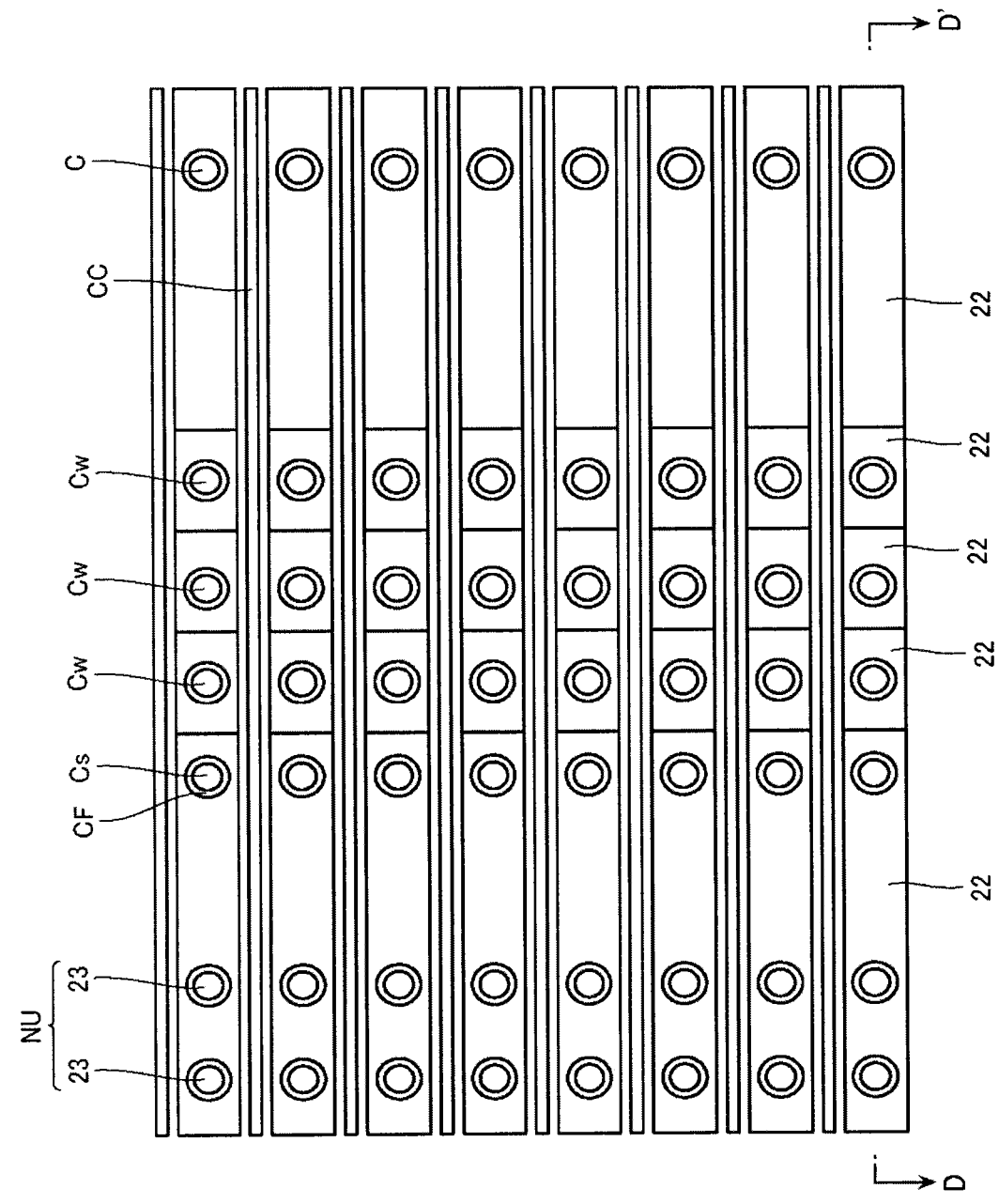
FIG. 7 is a plan view illustrating an example of the structure of the wiring section 20.
Figure 8:
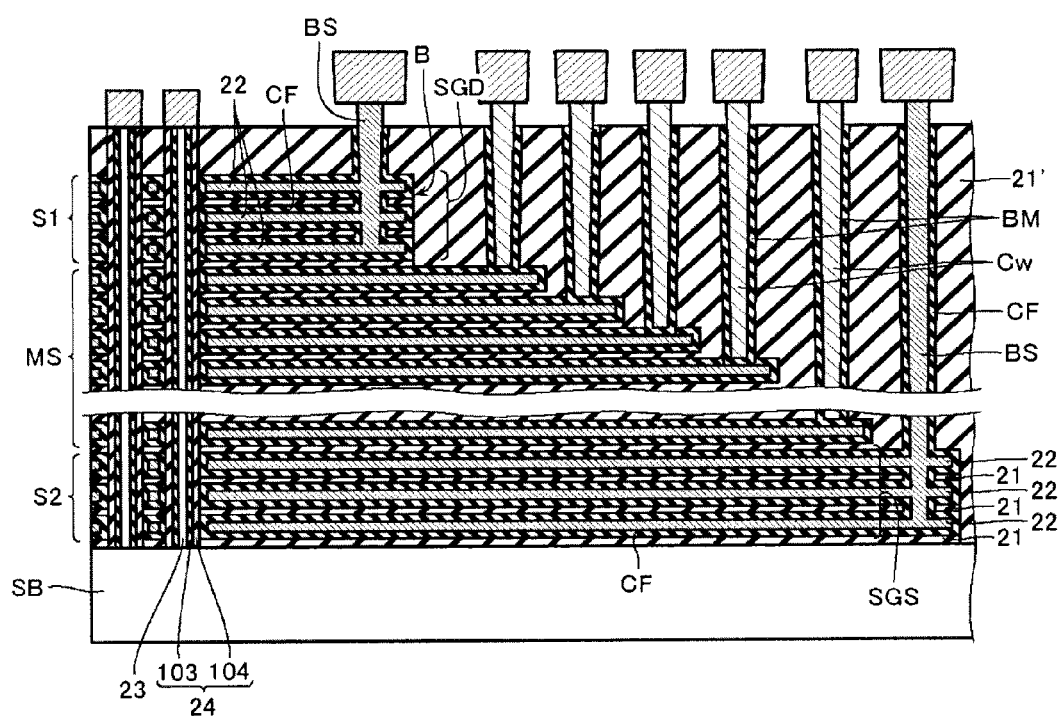
FIG. 8 is a sectional view of the X-direction of the wiring section 20 (D-D' sectional view of FIG. 7).

Next, with reference to FIGS. 5 to 8, the structures of the memory cell array 11 and the wiring section 20 will be described in detail. FIG. 5 is a plan view of a part of the memory cell array 11, and FIG. 6 is also a sectional view along the Y direction of the memory cell array 11 (a sectional view of the X-X' direction of FIG. 5). FIG. 7 is a plan view of the wiring section 20. FIG. 8 is a sectional view of the X direction of the wiring section 20 (D-D' sectional view of FIG. 7).

As shown in FIG. 5, the semiconductor layers 23 (semiconductor pillar members 102) are arranged along one line in an oblique direction with respect to the X direction (word-line direction) and the Y direction (bit-line direction), thereby increasing the arrangement concentration of the semiconductor layers 23, and increasing the arrangement concentration of the memory cells MC.

However, this is merely an example, and it is possible to arrange the semiconductor layers 23 along the X direction and the Y direction. In addition, the source contact LI is formed to have a stripe shape with the X direction as its lengthwise direction, and is embedded in the trench Tb via the interlayer insulating layer 21'.

As shown in FIG. 6, many trenches Ta are formed to penetrate the interlayer insulating layers 21 and the conductive films 22 laminated on the semiconductor substrate SB. The memory film 24 (a laminated films of the tunnel insulating film 103 and the charge storage layer 104) is formed along the sidewall of the trench Ta. Furthermore, the semiconductor layer 23 is embedded inside the trench Ta. The conductive film 22 is formed in contact with the memory film 24. However, the above-mentioned laminated film CF (the laminated film of the block insulating film 105, the block high-k dielectric film 106 and the barrier metal 107) is formed around the conductive film 22. That is, the conductive film 22 contacts with the memory film 24 via this laminated film CF.

Also, the above-described source contact LI is embedded in the trench Tb that divides the memory cell array 11 in a block basis, via the interlayer insulating layer 21'. The lower end of the source contact LI contacts with the diffusion layer 26 formed on the surface of the substrate SB, and the upper end thereof is connected to the source line SL through an upper wiring line.

Next, with Reference to FIGS. 7 and 8, the structure of the wiring section 20 will be described. As described above, the wiring section 20 is a wiring region for connecting the conductive layers 22 that function as the word lines WL or the select gate lines SGD, SGS to an external circuit via the contacts.

The conductive layers 22 that function as the word lines WL are formed to have a step-like shape in this wiring section 20 together with the interlayer insulating layer 21. Due to this, the conductive layers 21 may be independently connected to the contacts on upper surfaces thereof, respectively.

As shown in FIG. 8, the conductive layers 22 functioning as the word lines WL are connected to the word line driver circuit 12 shown in FIG. 1 by contacts Cw. Note that the contacts Cw are embedded, via barrier metal BM, in trenches formed in the interlayer insulating layer 21' that buries the wiring section 20.

On the other hand, as shown by a reference sign B in FIG. 8, the conductive layers 22 functioning as the drain-side select gate lines SGD are processed such that their ends in the X direction (the lengthwise direction of the select gate line) are aligned, not in a step-like shape.

In addition, the plural select gate lines SGD (the conductive layers 22) connected to one drain-side select transistor S1 (in the example in FIG. 8, three) are short-circuited by a common contact BS that penetrates them. By forming the contact BS that penetrates a plurality of the conductive layers 22 whose ends are aligned in the X direction, an area occupied by the drain-side select gate lines BS may become small. This may contribute to reduction of the area of the entire non-volatile semiconductor memory device. When a contact is formed to penetrate a plurality of conductive layers 22 that is made of metal such as tungsten, the process of penetrating metal films is highly difficult. However, such a structure may be easily processed by adopting a manufacturing method described below.

The above-mentioned laminated film CF (a laminated film of the block insulating film 105, the block high-k dielectric film 106 and the barrier metal 107) is formed at the periphery of the plurality of the conductive layers 22 and the contacts BS. In addition, the plurality of the conductive layers 22 and the contacts BS are in contact without any laminated film CF (including the barrier metal) at their boundaries. By contacting the contact BS to the conductive layers 22 without any barrier metal, the interface resistance between them is reduced, and the resistance of the select gate line SGD may be reduced.

Similarly, the conductive layers 22 functioning as the source-side select gate lines SGS are processed such that their ends in the X direction are aligned, not in a step-like shape. In addition, the plurality of the select gate lines SGS (the conductive layers 22) connected to one source-side select transistor S2 are short-circuited by the common contact BS. The above-mentioned laminated film CF (a laminated film of the block insulating film 105, the block high-k dielectric film 106 and the barrier metal 107) is formed at the periphery of the plurality of the conductive layers 22 and the contacts BS. In addition, the plurality of the conductive layers 22 and the contacts BS are in contact without any laminated film CF (including the barrier metal) at their boundaries. By contacting without any barrier metal therebetween, the interface resistance between them is reduced, and the resistance of the select gate line SGS may be reduced.

Note that the conductive layers 22 are formed by, as described in detail later, after sacrifice films has been removed by wet etching, embedding a conductive material in a gap where the sacrifice film has been removed. Accordingly, the wiring section 20 comprises slit regions CC located at a certain interval, as shown in FIG. 7.

The sacrifice film is removed by wet etching solution that enters through the slit regions CC. In addition, through the gaps that are left after the removal of the sacrifice film in the slit regions CC, the above-mentioned laminated film CF and the conductive layers 22 are deposited using a chemical vapor deposition (CVD) method. After the laminated film CF and the conductive layers 22 have been deposited, an insulating film is buried in the slit regions CC.

Figure 9:
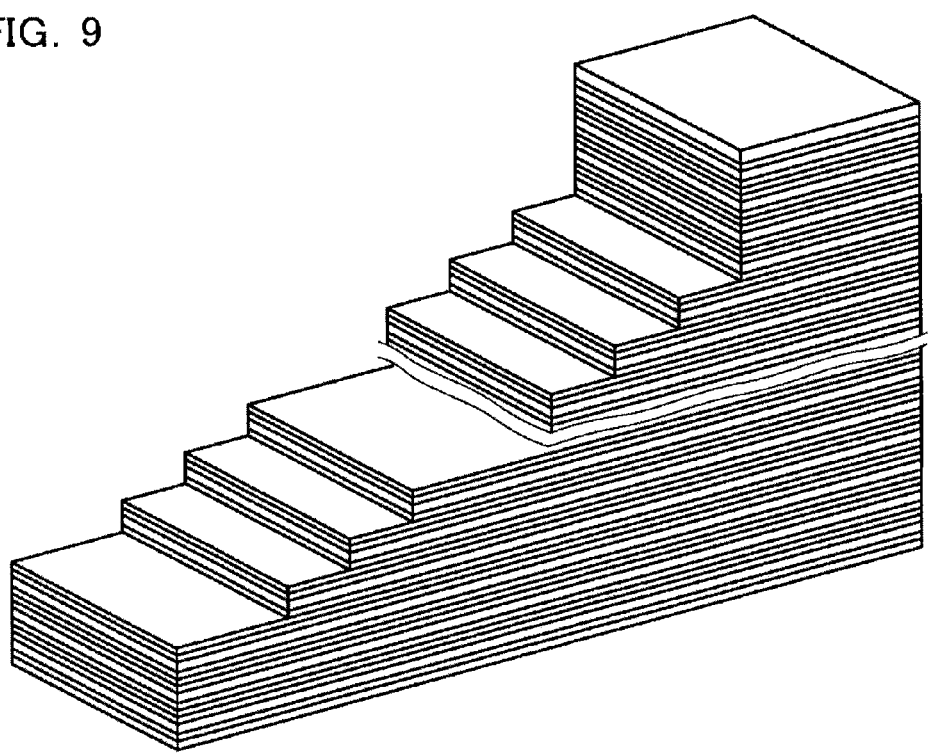
FIG. 9 is a schematic perspective view illustrating one example of a structure of the wiring section 20.
Figure 10:
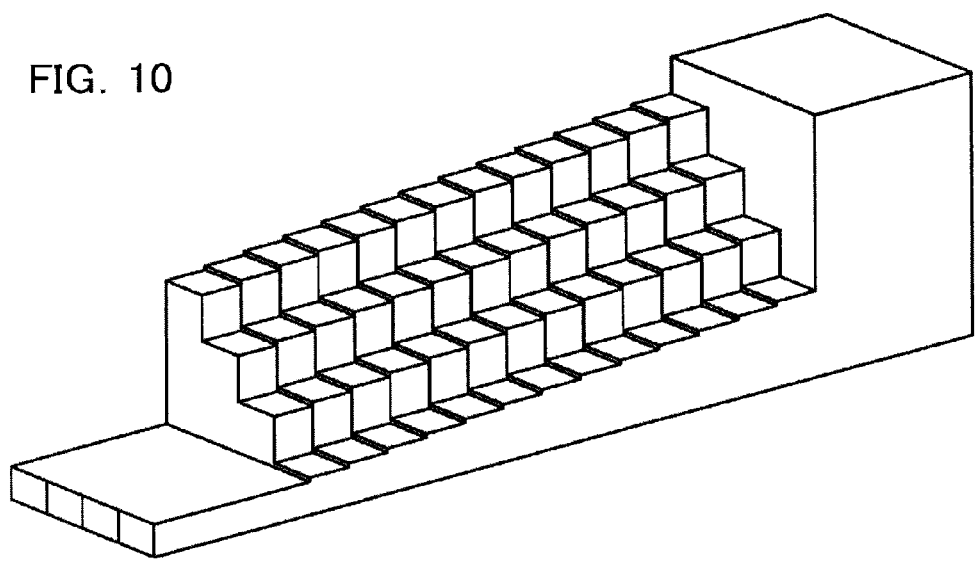
FIG. 10 is a schematic perspective view illustrating one example of a structure of the wiring section 20.

Note that the conductive layers 22 constituting the word lines WL may have a step-like portion extending in one direction only in the X direction as shown in FIG. 9, or they may have a step-like portion extending two-dimensionally as shown in FIG. 10.

Figure 11A:
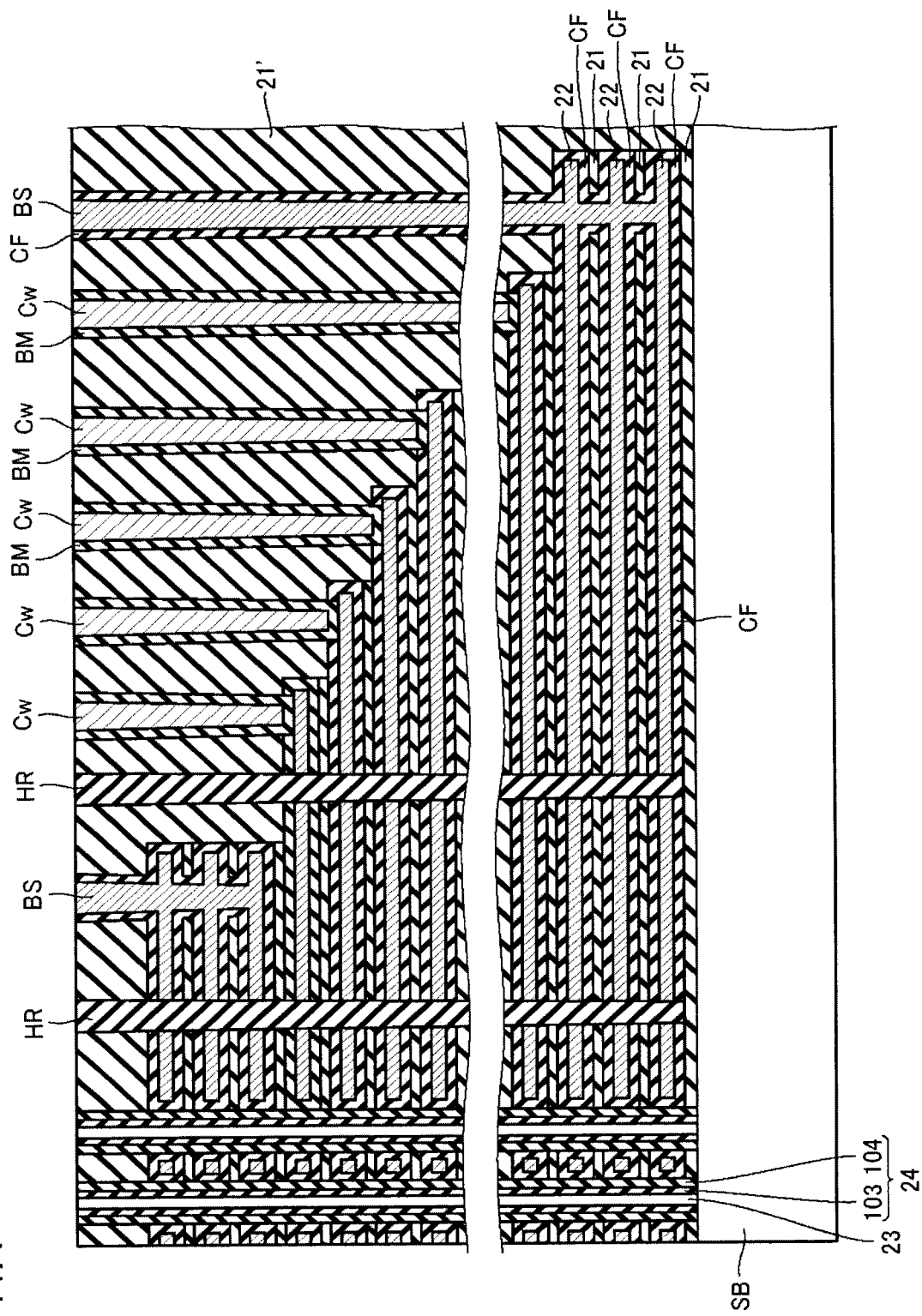
FIG. 11A is an enlarged cross-sectional view illustrating a structure of the wiring section 20.
Figure 11B:
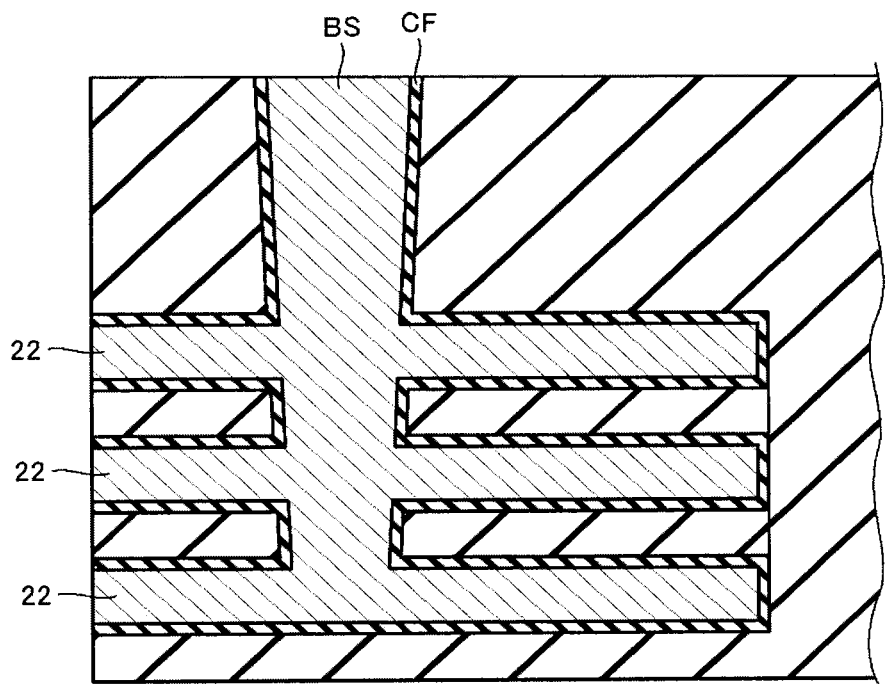
FIG. 11B is a more-enlarged view of the conductive layers 22 (select gate lines SGS and SGD) of the select transistor S1 or S2.
Figure 11C:
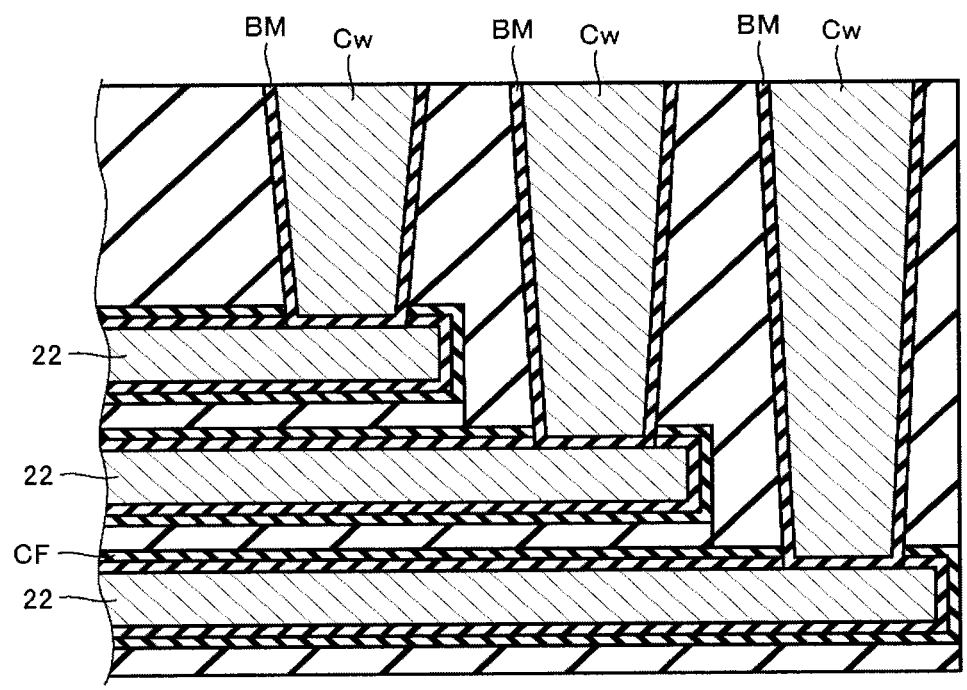
FIG. 11C is a more-enlarged view of the conductive layers 22 (word lines WL) of the memory cells MC.
Figure 12:
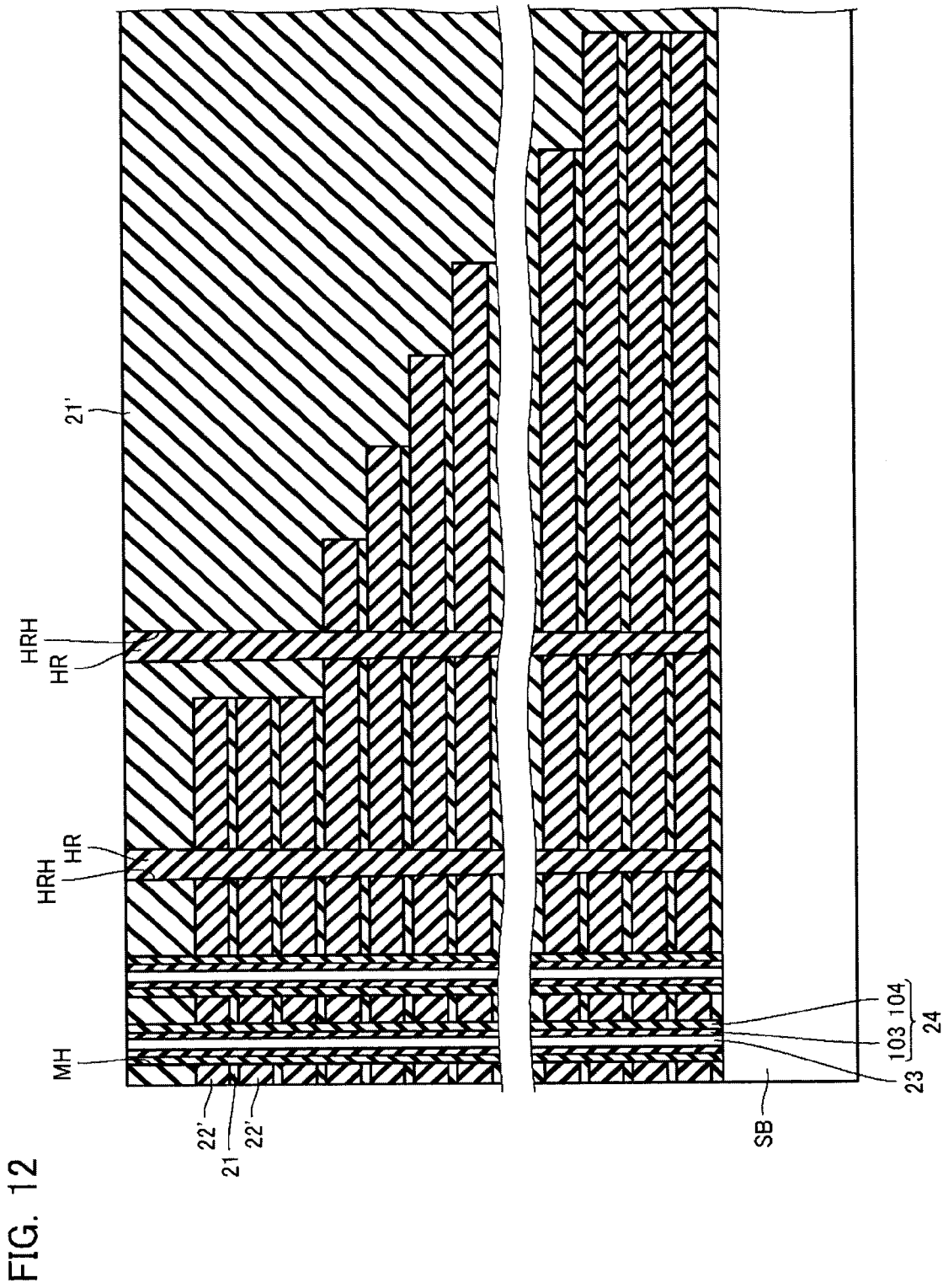
FIG. 12 is a process chart illustrating a manufacturing method of the memory cell array 11 and the wiring section 20.

FIG. 11A is an expanded sectional view illustrating the structure of the wiring section 20. FIG. 11B is a further enlarged view of the part of the conductive layers 22 of the select transistor S1 or S2 (the select gate lines SGS, SGD). FIG. 11C is a further enlarged view of the part of the conductive layer 22s of the memory cells MC (the word lines WL).

Although Illustration thereof in FIG. 8 is omitted for simplification of explanation, the wiring section 20 includes support members HR, as shown in FIG. 11A. The support member HR has a role of supporting the interlayer insulating layers after removing the sacrifice films for forming the word lines WL, and the select gate lines SGD, SGS, in order to avoid the collapsing of the left interlayer insulating layers. The support members HR are formed of the same material as that of the interlayer insulating layer, for example, a silicon oxide film, and are formed in the wiring section 20 at a certain interval. Note that it is preferable that the contact BS is separated from the end portion of the support member HR by a distance of 20 nm or more, and is arranged within the distance of 1000 nm from the center of the support member HR. More preferably, in consideration of the collapsing risk due to stress, it is arranged within the distance of 400 nm from the center of the support member HR. This is because, when the contact BS is away from the support member HR by a distance of 1000 nm or more, the risk of collapsing of the wiring section 20 may become larger in the removal process of the sacrifice film. Although FIG. 11A illustrates two support member HR, this is merely an example, and it is not limited to this example.

The support member HR penetrates not only the select gate lines SGS or SGD but also the word lines WL to prevent collapsing of the structure where the word lines WL are formed.

As shown in the enlarged view of FIG. 11B, a plurality of the conductive layers 22 forming the select gate lines SGS or SGD are commonly connected by the contact BS penetrating through them. In addition, this contact BS is formed by a process that is identical to that of the plural conductive layers 22 forming the select gate lines SGS and SGD, and at the same time as the plural conductive layers. Thus, as shown in FIG. 11B, the contacts BS are connected seamlessly to the conductive layers 22, without being divided by the laminated film CF (barrier metal) at the boundaries therebetween. In other words, the laminated film CF is formed only at the periphery of the final structures of the conductive layer 22 and the contacts BS, but is not formed at the boundary between the conductive layers 22 and the contacts BS. This structure may be obtained because the manufacturing method to be described below is adopted.

On the other hand, as shown in the enlarged view of FIG. 11C, a plurality of the conductive layers 22 that form the word lines WL are connected to the different contacts Cw, respectively, via the barrier metal BM. The contacts Cw are formed by a process that is different from the process of depositing a plurality of the conductive layers 22 that are to be the word lines WL. Thus, the barrier metal BM is also formed in the boundary between the contacts Cw and the conductive layers 22 that are to be the word lines WL. Note that the contacts Cw may be formed by the same process as that of the conductive layers 22, similar to the contacts BS. In this case, the contacts Cw and the conductive layers 22 for the word lines WL may be connected seamlessly, without forming the barrier metal BM at the boundary thereof.

[Manufacturing Method of Wiring Section 20]

Next, a method of manufacturing the memory cell array 11 and the wiring section 20 will be described with reference to FIG. 12 to FIG. 18.

First, the interlayer insulating layers 21 formed of silicon oxide films, for example, and the sacrifice film 22' formed of silicon nitride films are alternately stacked. Then, the end portions of them are formed to a step-like shape. The step-like portion may be formed by gradually retreating the resist film. After that, the entire part of the wiring section 20 is covered by the interlayer insulating layer 21'. Then, memory holes MH penetrating therethrough are formed, and the memory film 24 and the semiconductor layers 23 are embedded in the memory holes MH using CVD method or the like. Furthermore, through-holes HRH penetrating the wiring section 20 are formed, and then, a silicon oxide film is embedded in the through-hole HRH, for example to form the above-mentioned support members HR. The above-described processes may complete the structure shown in FIG. 12.

Figure 13:
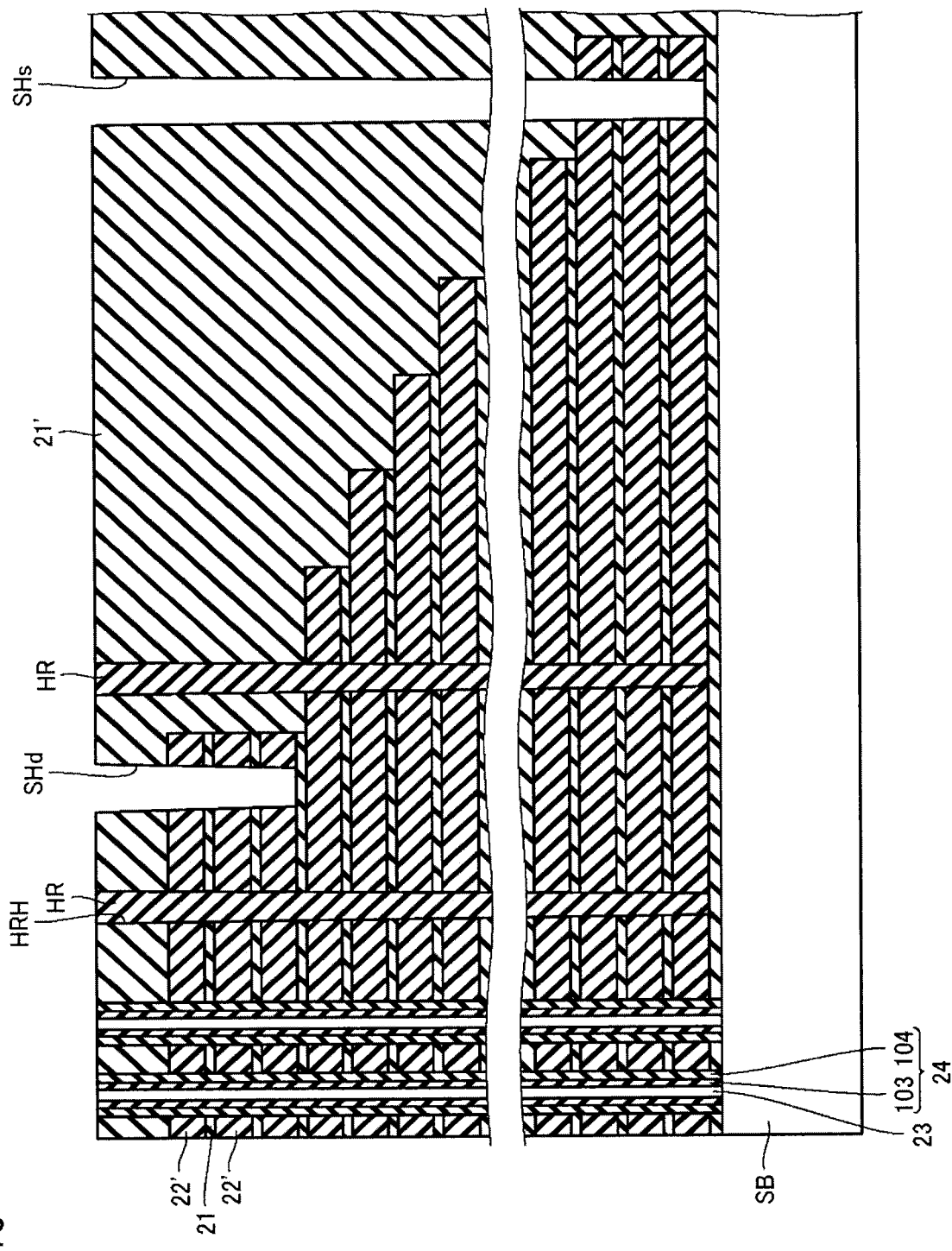
FIG. 13 is a process chart illustrating a manufacturing method of the memory cell array 11 and the wiring section 20.
Figure 14:
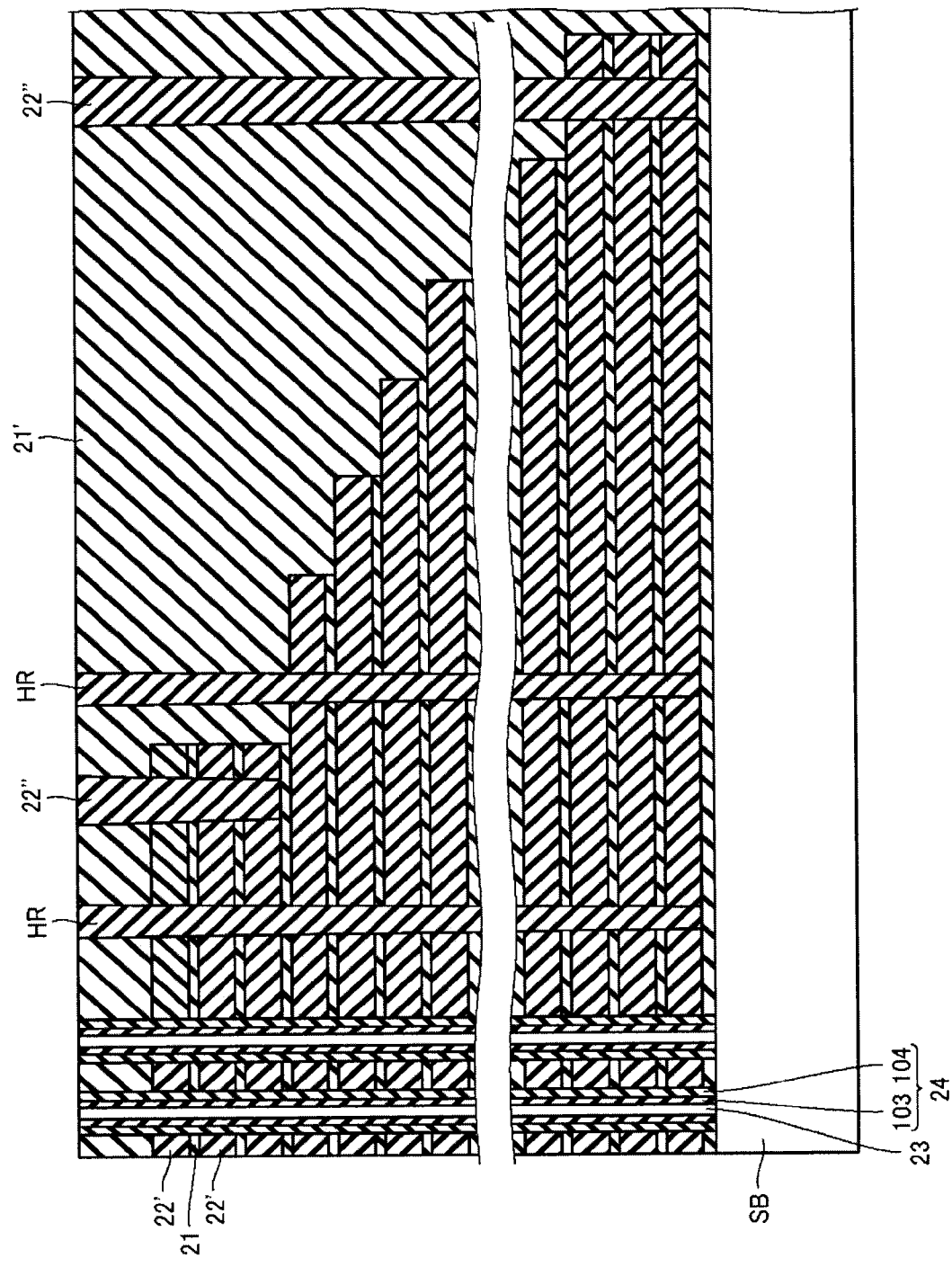
FIG. 14 is a process chart illustrating a manufacturing method of the memory cell array 11 and the wiring section 20.

Subsequently, as shown in FIG. 13, through-holes SHd and SHs are formed in a portion where the select gate lines SGD and SGS are formed. In addition, as shown in FIG. 14, a sacrifice film 22" formed of a silicon nitride film is formed in these through-holes SHd and SHs.

Figure 15:
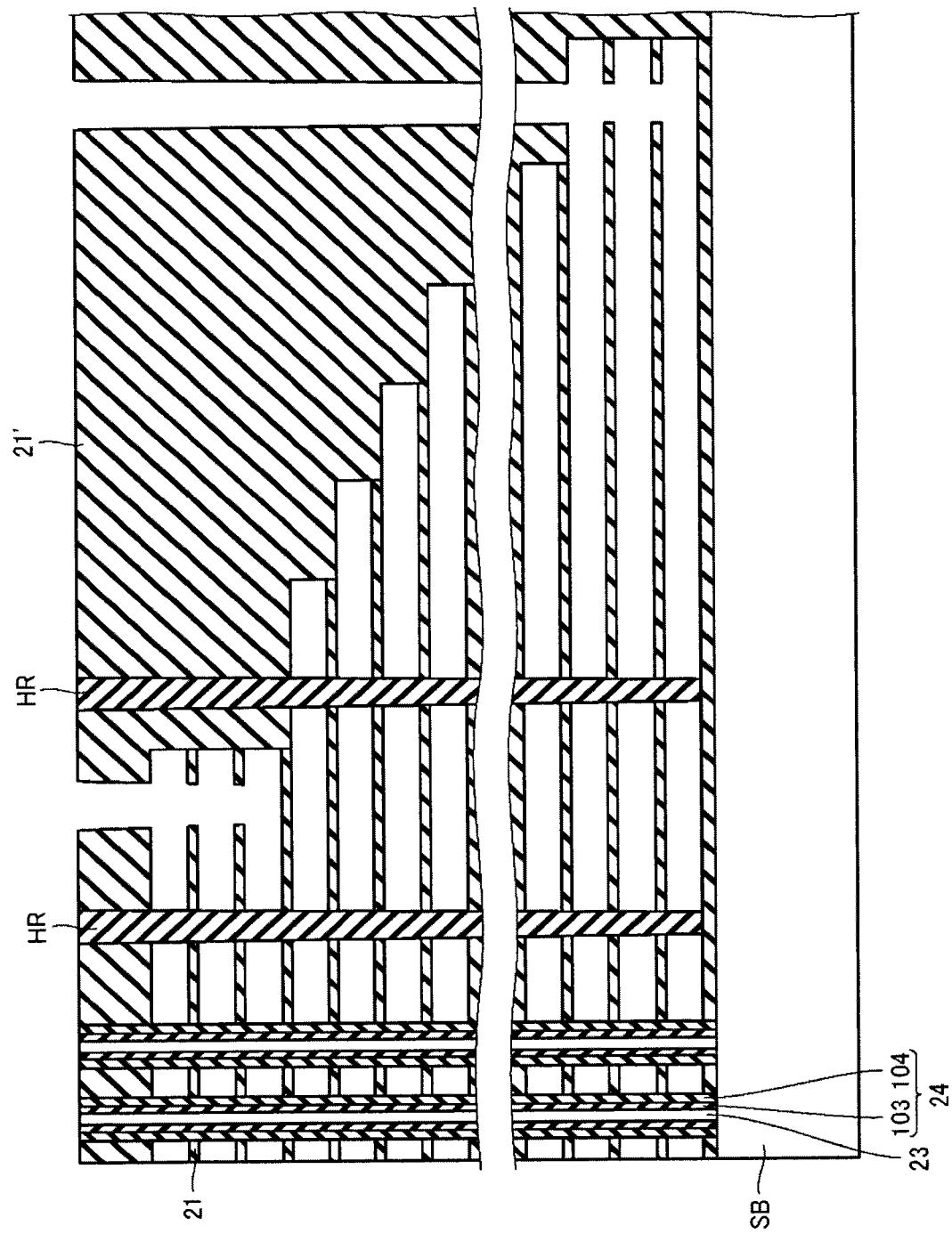
FIG. 15 is a process chart illustrating a manufacturing method of the memory cell array 11 and the wiring section 20.
Figure 16:
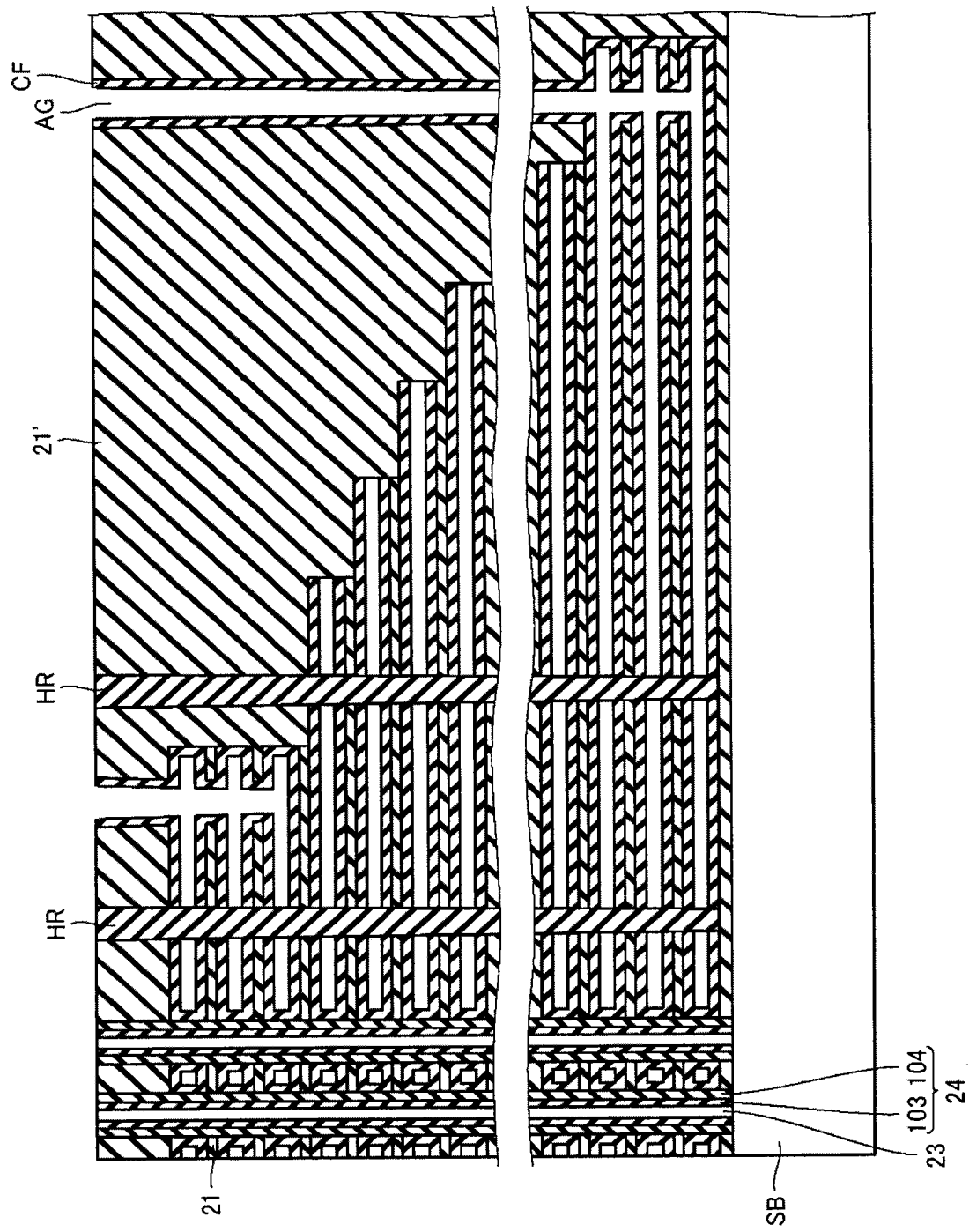
FIG. 16 is a process chart illustrating a manufacturing method of the memory cell array 11 and the wiring section 20.

Then, although illustration thereof is omitted, the slit regions CC are formed as shown in FIG. 7. Thereafter, as shown in FIG. 15, wet etching is performed using hot phosphoric acid solution or the like to remove the sacrifice films 22' and 22". Subsequently, as shown in FIG. 16, the above-described laminated film CF is deposited, using CVD or the like, along a cavity formed after the sacrifice film 22' and 22" are removed.

Figure 17:
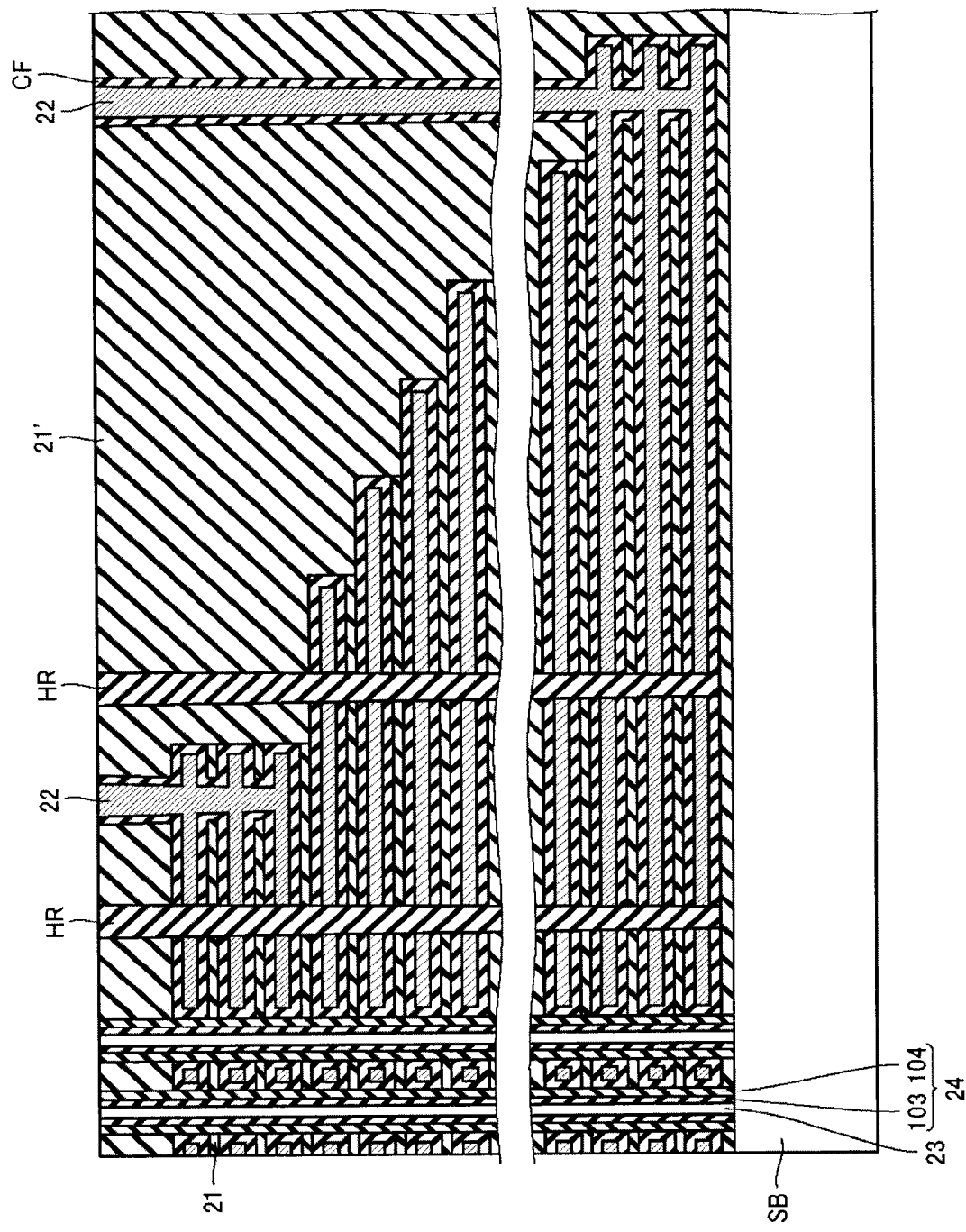
FIG. 17 is a process chart illustrating a manufacturing method of the memory cell array 11 and the wiring section 20.

In addition, as shown in FIG. 17, a metal film such as tungsten (W) is deposited, using CVD or the like, in a cavity after the laminated film CF is deposited to form the conductive layers 22. This process forms the word line WL, the select gate lines SGS, SGD and the contact BS. Since the contacts BS and the select gate lines SGS and SGD are formed by the same CVD process, no laminated film CF including the barrier metal is formed at the boundary between them.

Finally, after forming the through-holes reaching the conductive layers 22 that are to be the word lines WL, a barrier metal BM is deposited on a sidewall of the through-holes. Next, a metal film such as tungsten is embedded to bury the through-holes to form the contacts Cw. These processed may complete the structure shown in FIG. 11A.

[Advantage]

As described above, according to the first embodiment, a select transistor with high selectivity is provided, and a non-volatile semiconductor memory device having a three-dimensional structure with a reduced resistance of the select transistor may be obtained.

Second Embodiment

Next, a nonvolatile semiconductor memory device according to the second embodiment will be described with reference to FIG. 18. The entire structure of this second embodiment is the generally the same as that of the first embodiment (FIG. 1 to FIG. 8). However, this second embodiment is different from the first embodiment in the structure of the wiring section 20.

Figure 18:
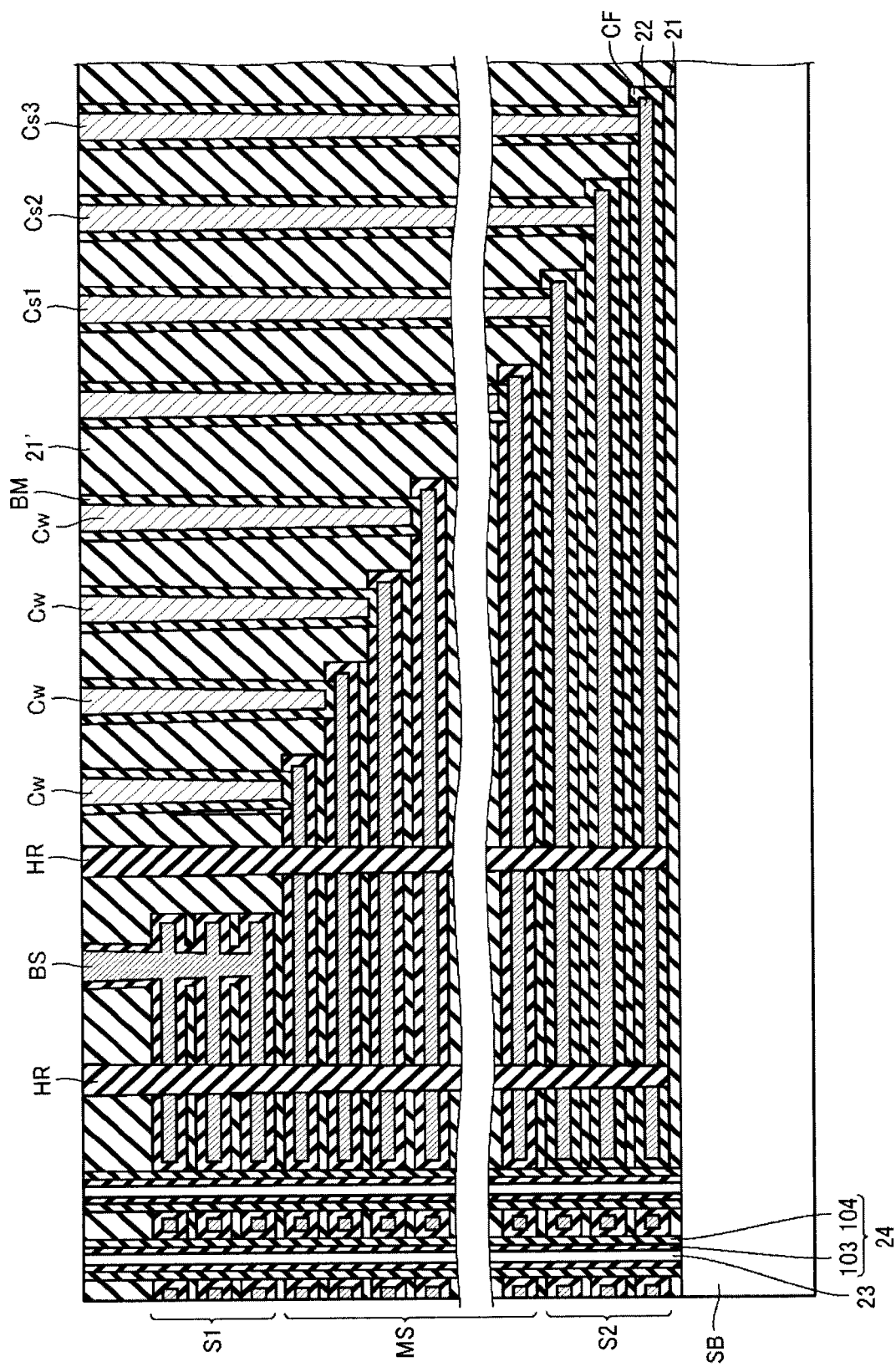
FIG. 18 is a sectional view illustrating the structure of the nonvolatile semiconductor memory device according to the second embodiment.

FIG. 18 is a partial sectional view of the wiring section 20 of the nonvolatile semiconductor memory device according to the second embodiment.

In this second embodiment, three conductive layers 21 connected to the source-side select transistor S2 have a structure where each of these three conductive layers 21 are connected to any one of independent contacts Cs1, Cs2, and Cs3. These contacts Cs1, Cs2 and Cs3 may be independently voltage-controlled, or may be short-circuited at their upper ends, are subject to control like in the first embodiment.

Note that the contacts Cs1 to Cs3 may be connected to the conductive layers 22 seamlessly, without any laminated film CF at the boundary therebetween, similar to the first embodiment (cf. FIG. 18). Instead of this, the contacts Cs1 to Cs3 may be formed by a process different from that of the conductive layers 22, similar to the process of the contacts Cw. In this case, the barrier metal BM is formed at the boundary between the contacts Cs1 to Cs3 and the conductive layer 22, like in the contacts Cw.

In addition, FIG. 18 illustrates an example where the plural conductive layers 22 of the drain-side select transistor S1 are commonly connected to the common contact BS, and the plural conductive layers 22 of the source-side select transistor S2 are independently connected to any one of contact Cs1 to CS2.

However, contrary to this, it is possible that the plural conductive layers 22 of the source-side select transistor S2 are commonly connected to the contact BS, and the plural conductive layers of the drain-side select transistor S1 are independently connected to any one of contact Cs1 to CS2. This second embodiment may have the same advantage as the first embodiment.

Third Embodiment

Next, a nonvolatile semiconductor memory device according to the third embodiment will be described with reference to FIG. 19. The entire structure of this embodiment is generally the same as that of the first embodiment (FIG. 1 to FIG. 8). However, this third embodiment is different from the first embodiment in the structure of the wiring section 20.

Figure 19:
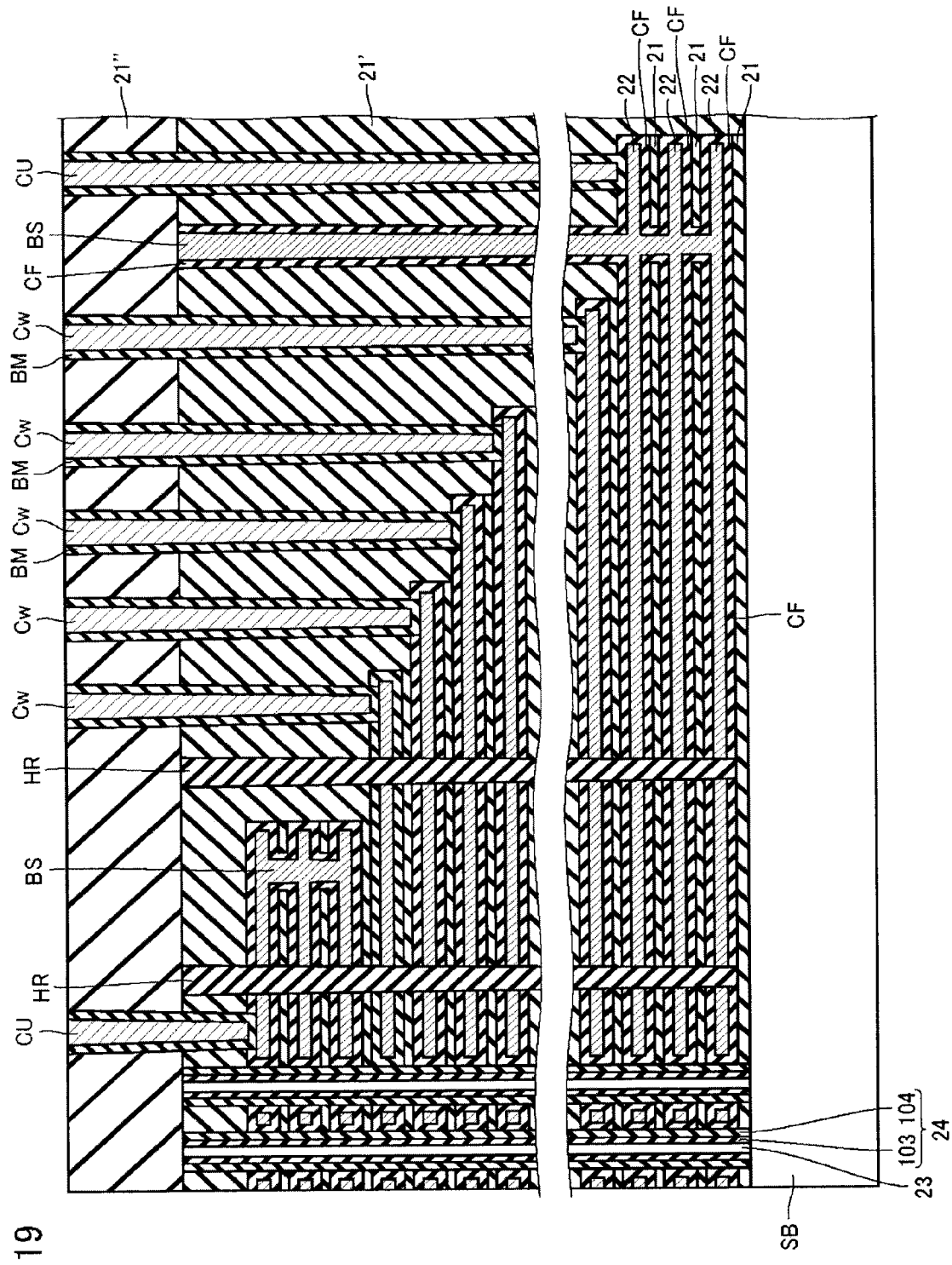
FIG. 19 is a sectional view illustrating the structure of the nonvolatile semiconductor memory device according to the third embodiment.

FIG. 19 is a partial sectional view of the wiring section 20 of the nonvolatile semiconductor memory device according to the third embodiment. In this third embodiment, another interlayer insulating layer 21" is further formed on the interlayer insulating layer 21', and another contact CU different from the contact BS is embedded in this interlayer insulating layer 21'. In this structure, the contact BS may have a form that does not protrude from the uppermost conductive layer 22, as shown in FIG. 19.

The contact CU is configured to contact with one of the conductive layers 22 of the drain-side select transistor S1, e.g., the uppermost conductive layer 22. This contact CU connects the select gate SGD to an external circuit. The contact CU is configured to penetrate the interlayer insulating layer 21" formed on the upper side of the interlayer insulating layer 21', and penetrate the inter layer insulating layer 21' to reach the uppermost conductive layer 22. On the other hand, the contact BS has in this embodiment only serves to short-circuit a plurality of the conductive layers 22.

The contact CU is configured to connect to the uppermost conductive layer 22 among the plurality of the conductive layers 22 in the source-side select transistor S2. This contact CU connects to an external circuit.

The contact CU is configured to penetrate the interlayer insulating layer 21" formed on the upper side of the inter-layer insulating layer 21', and penetrate the inter layer insulating layer 21' to reach the uppermost conductive layer 22 in the source-side select transistor S2.

This third embodiment may have the same advantage as the first embodiment.

Fourth Embodiment

Next, a nonvolatile semiconductor memory device according the fourth embodiment will be described with reference to FIG. 20. The entire structure of this embodiment is generally the same as that of the first embodiment (FIG. 1-FIG. 8). However, this third embodiment is different from the first embodiment in the structure of the wiring section 20.

Figure 20:
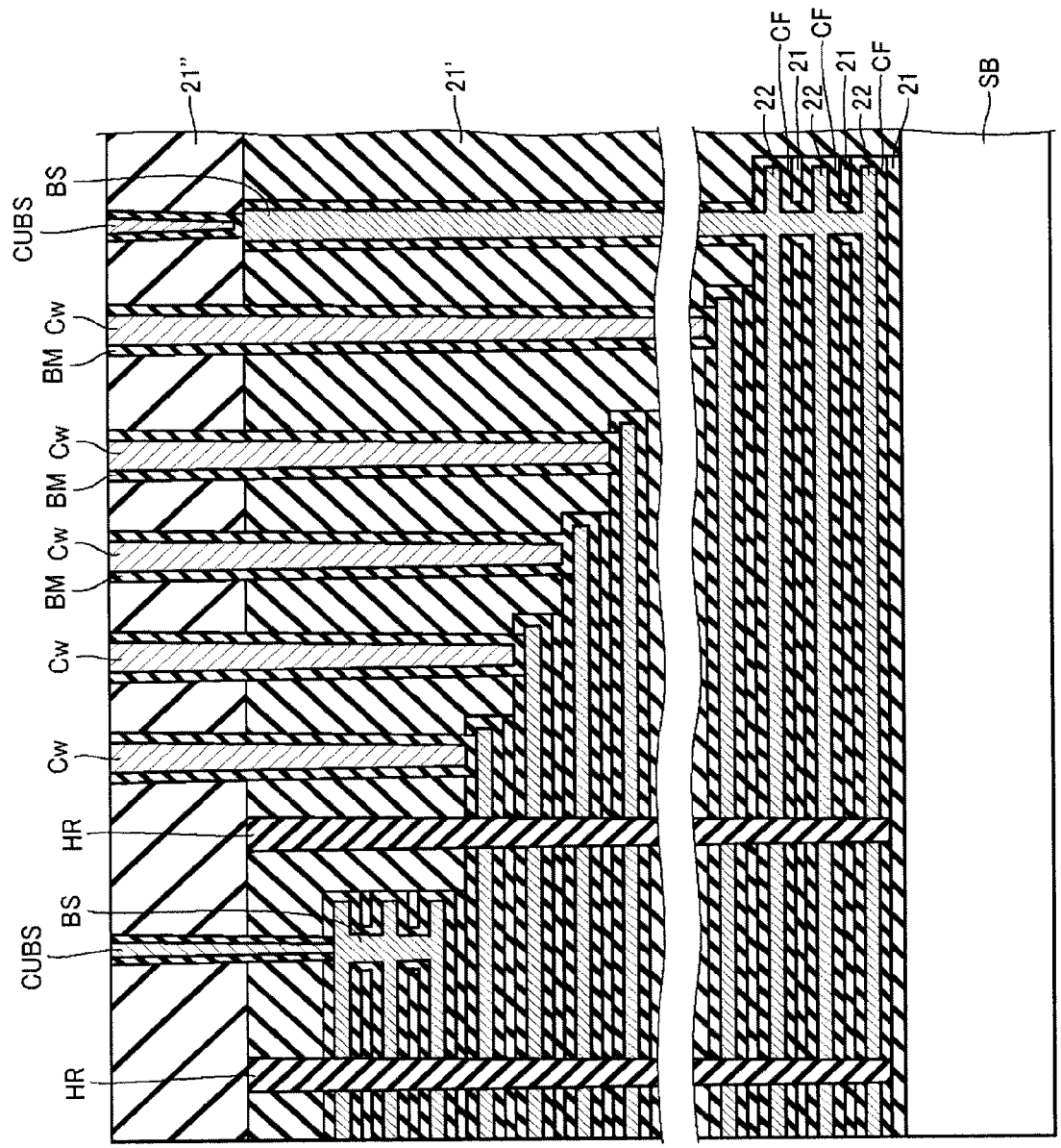
FIG. 20 is a sectional view illustrating the structure of the nonvolatile semiconductor memory device according to the fourth embodiment.
Figure 21:
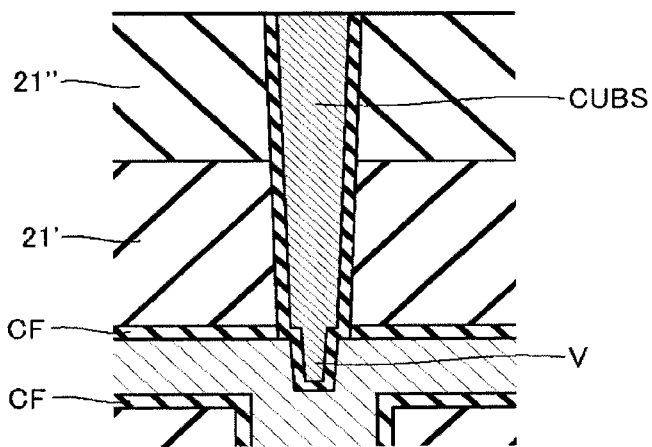
FIG. 21 is a sectional view illustrating the structure of the nonvolatile semiconductor memory device according to the fourth embodiment.

FIG. 20 is a partial sectional view of the wiring section 20 of the nonvolatile semiconductor memory device according to the fourth embodiment.

In this fourth embodiment, another interlayer insulating layer 21" is further formed on the interlayer insulating layer 21', and another contact CUBS that connects to the upper end of the contact BS is embedded in this interlayer insulating layer 21'. The contact CUBS is formed so that the lower end thereof is connected to the upper end of the contact BS. The contact Cw penetrates the interlayer insulating layer 21" and the interlayer insulating layer 21', and to reach the word line WL.

Note that the contact CUBS may have a structure simply connected to the upper end of the contact BS. Alternatively, the contact CUBS may have a structure that protrudes into a gap V (void) inside the contact BS.

This fourth embodiment may have the same advantage as the first embodiment.

Modified Example

Examples of the arrangement of the support members HR, the contacts BS, CU and CUBS in the above-described embodiments will be described with reference to the drawings.

Figure 22:
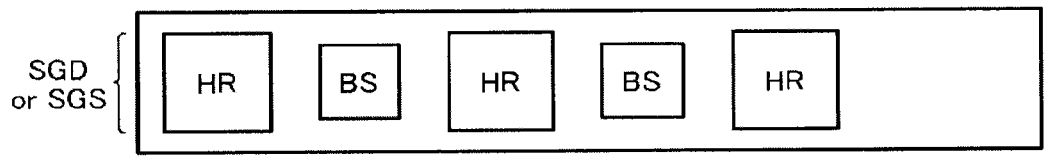
FIGS. 22 to 33 show modified examples.
Figure 23:
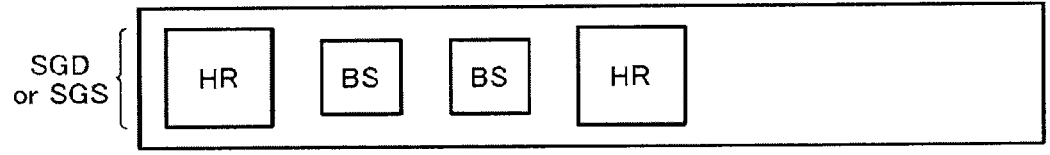
Figure 24:
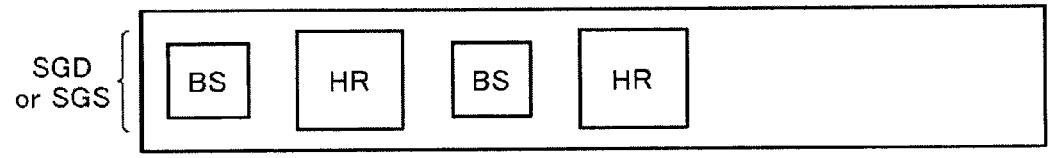

For example, as shown in FIGS. 22 to 24, in the first embodiment, it is possible to adopt an arrangement in which the support members HR and the contacts BS are arranged along one line in the X direction in one select gate line SGD or SGS. Regarding the number of arranged support members HR and the contacts BS and the order of arrangements of the support members HR and the contacts BS, any number of arranged support members HR and the contacts BS and any order of arrangement may be adopted, as far as the collapsing at the time of removal of the sacrifice film may be prevented.

Figure 25:
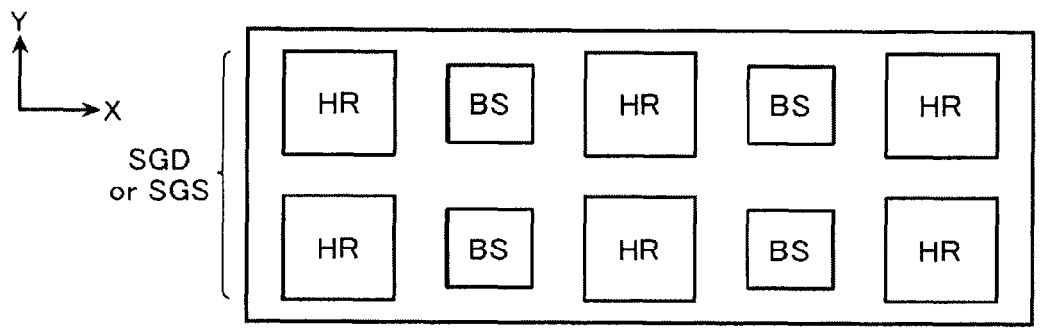
Figure 26:
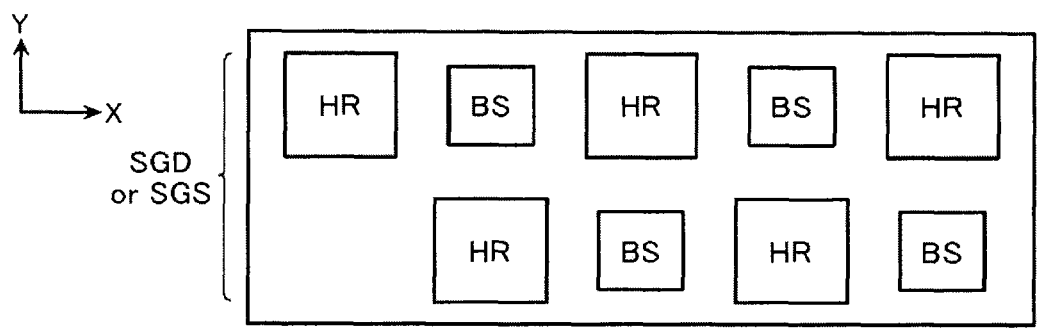
Figure 27:
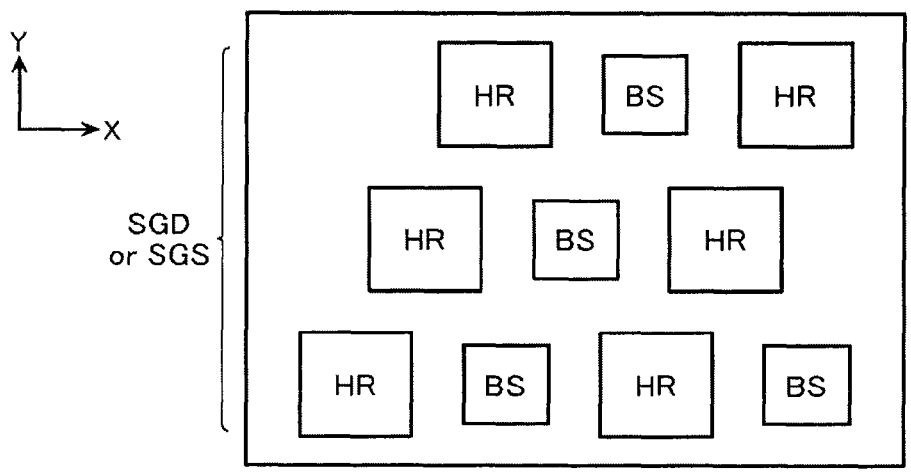

In addition, as shown in FIGS. 25 to 27, in the first embodiment, it is possible to adopt an arrangement in which the support members HR and the contacts BS are arranged along plural columns in the X direction in one select gate line SGD or SGS. In this case, as shown in FIG. 25, it is possible to adopt an arrangement where a plurality of contacts BS are arranged along one line in the Y direction, and the support members HR are arranged along one line in the Y direction. Instead of this, as shown in FIG. 26, both the support members HR and the contacts BS may be arranged along a diagonal direction with respect to the X direction and the Y direction.

Also, as shown in FIG. 27, it is possible to adopt an arrangement where the positions of the support members HR and the contacts BS are different in the Y direction by the half-pitch.

Figure 28:
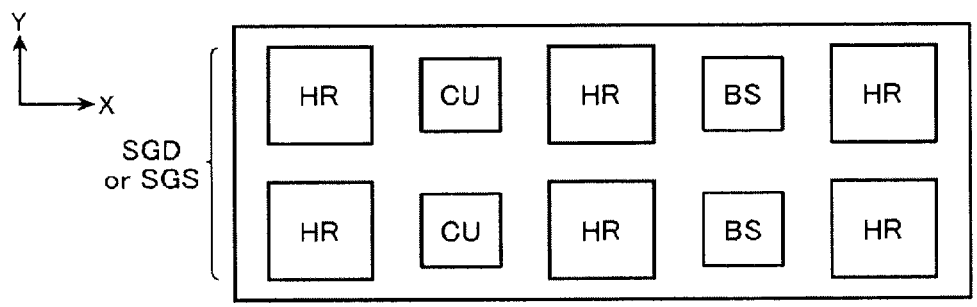
Figure 29:
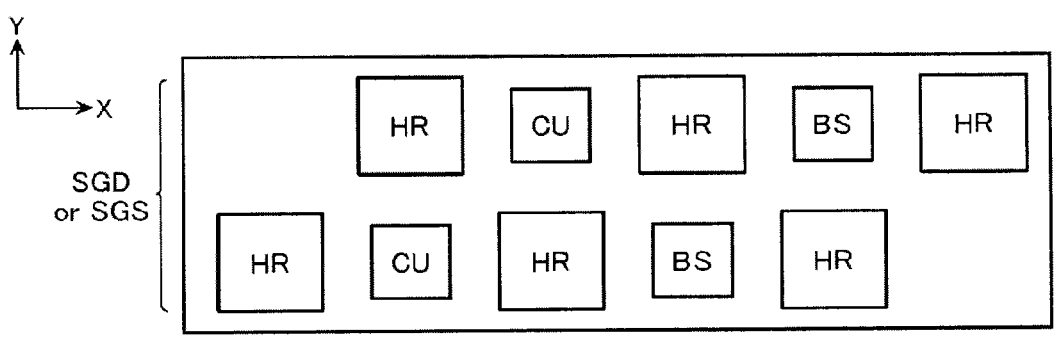
Figure 30:
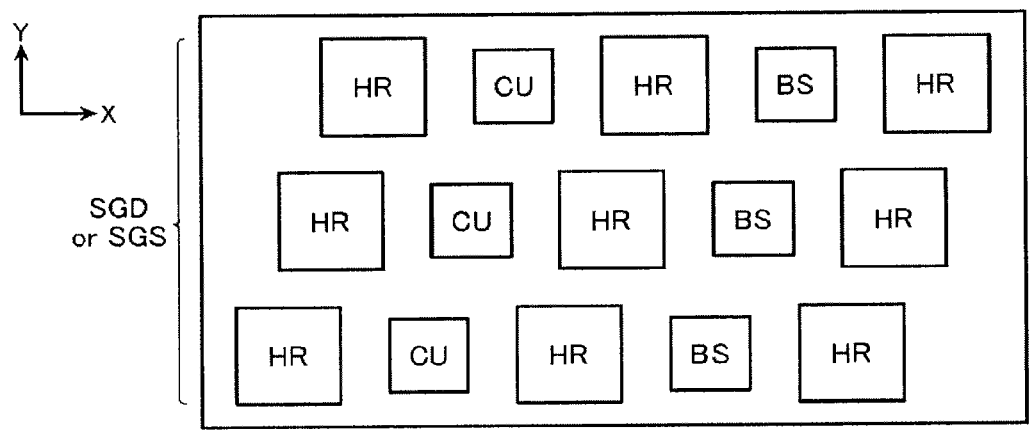

In addition, as shown in FIGS. 28-33, even in a configuration including contacts CU in addition to the contacts BS, it is possible to employ a configuration in which the contacts BS, the support members HR and the contacts CU are arranged along plural columns along the X direction in one select gate line SGD or SGS. In this case, as shown in FIG. 28, it is possible to adopt a configuration in which a plurality of the contact BS are arranged in one line along the Y direction, the support members HR are arranged in one line along the Y direction, and the contacts CU are arranged in one line along the Y direction. Instead of this, as shown in FIG. 29, it is possible to adopt a configuration in which the contacts BS, the support members HR and the contacts CU are arranged in diagonal directions with respect to the X direction and the Y direction. Furthermore, as shown in FIG.

Figure 31:
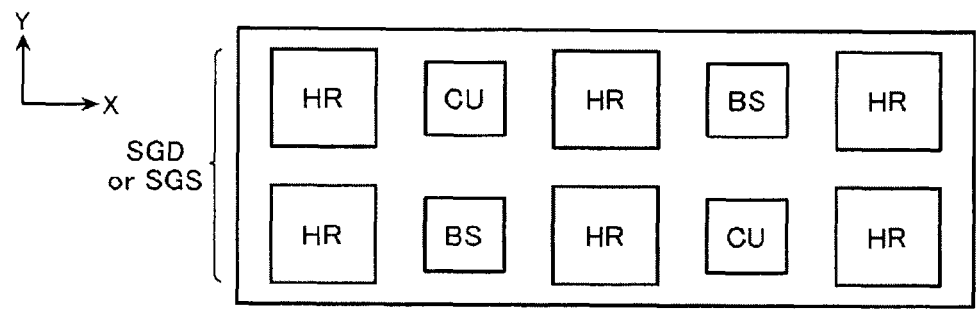
Figure 32:
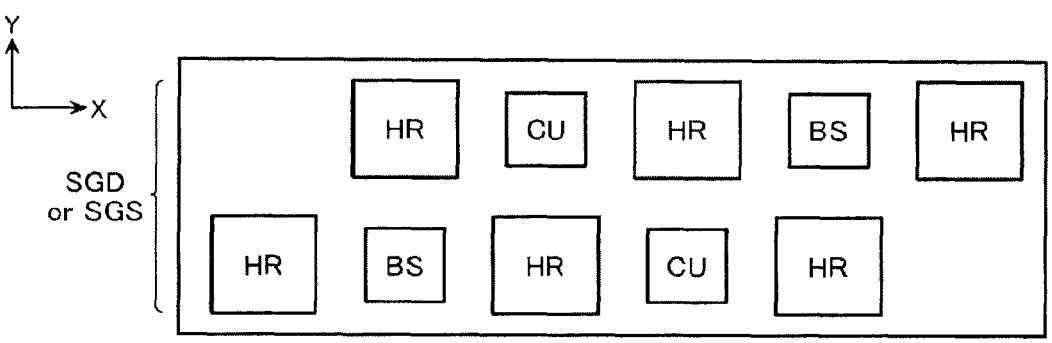
Figure 33:
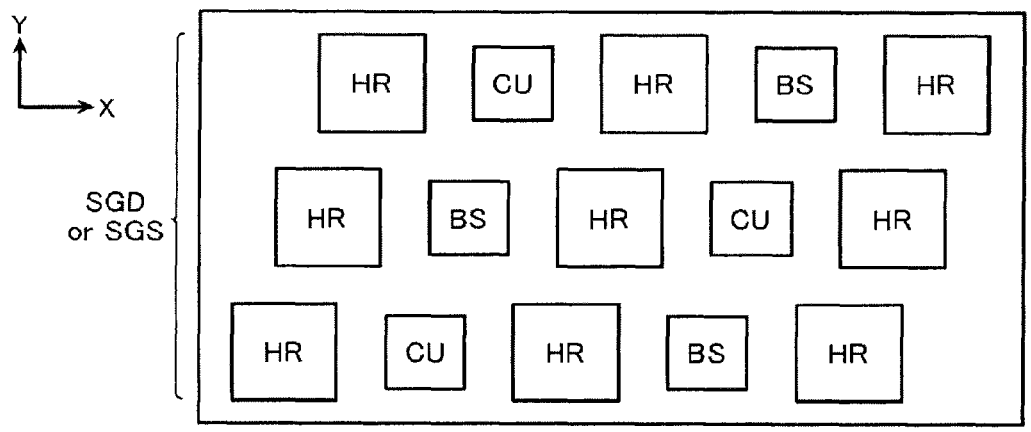

30, it is possible to adopt a configuration in which the positions of these elements are different in the Y direction by the half-pitch. In addition, as shown in FIG. 31, only the support members HR may be arranged in a direction along the Y direction. Also, as shown in FIG. 32, only the support member HR may be arranged along one line along the diagonal direction. In addition, it is possible that only the positions of the support members HR in the Y direction are different by the half-pitch.

[Charge Storage Layer 104]

As a material of the charge storage layer 104, the above-described embodiments explained a silicon nitride film (SiN). However, the following oxide materials may also be selected.

*$SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO

*$AB_2O_4$ (where A and B are the identical or different elements, and they are any one of Al, Sc, Ti, V, Cr, Mn, Fe, Co, Ni, Cu, Zn, Ga, and Ge. For example, they may be $Fe_3O_4$, $FeAl_2O_4$, $Mn_{1+x}Al_{2-x}O_{4+y}$, $Co_{1+x}Al_{2-x}O_{4+y}$, $MnO_x$ and the like)

*$ABO_3$ (where A and B are the identical or different elements, and they are any one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, they may be $LaAlO_3$, $SrHfO_3$, $SrZrO_3$, $SrTiO_3$, and the like).

In addition, as a material of the charge storage layer 104, oxynitride materials listed below may be selected.

*SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON

Furthermore, a material in which some of the oxygen elements in the above-mentioned oxide material are replaced by nitrogen elements may be employed. Particularly, it is preferable that a single or a plurality of insulating layers may be selected from a group of $SiO_2$, SiN, $Si_3N_4$, $Al_2O_3$, SiON, $HfO_2$, HfSiON, $Ta_2O_5$, $TiO_2$, and SrTiO3, respectively.

Particularly, regarding silicon-based insulating films such as $SiO_2$, SiN, and SiON, the concentration of oxygen elements or nitrogen element may be set at not less than $1 \times 10^{18}$ atoms/cm$^3$, respectively. However, the barrier heights of the plurality of the insulating layers are different from each other. Also, the insulating layer may include impurities atom that causes defect levels, or a material including semiconductor/metal dots (quantum dots).

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
a memory cell array including a memory string and a select transistor, the memory string including a plurality of memory cells connected in series, the memory string being formed to extend in a first direction, and the select transistor being connected to one end of the memory string; and
a wiring section in which a conductive layer and an interlayer insulating layer are laminated alternately to form plural layers,
one select transistor including a plurality of conductive layers, and the plurality of the conductive layers being connected in common by a common first contact,
the plurality of the conductive layers and the first contact including a barrier metal formed in a periphery thereof, and
the plurality of the conductive layers and the first contact being in contact without the barrier metal therebetween at a boundary thereof.

2. The nonvolatile semiconductor memory device according to claim 1, further comprising a second contact electrically connected to one of the plurality of the conductive layers.

3. The nonvolatile semiconductor memory device according to claim 1, further comprising a third contact having a lower end electrically connected to an upper end of the first contact.

4. The nonvolatile semiconductor memory device according to claim 1, wherein the plurality of the conductive layers included in the one select transistor have ends aligned in their lengthwise direction.

5. The nonvolatile semiconductor memory device according to claim 4, further comprising a second contact electrically connected to one of the plurality of the conductive layers.

6. The nonvolatile semiconductor memory device according to claim 4, further comprising a third contact having a lower end electrically connected to an upper end of the first contact.

7. The nonvolatile semiconductor memory device according to claim 1, wherein
the select transistor includes a first select transistor that controls a connection between a bit line and the memory string, and a second select transistor that controls a connection between a source line and the memory string.

8. The nonvolatile semiconductor memory device according to claim 7, wherein
wherein the plurality of the conductive layers included in the one select transistor have ends aligned in their lengthwise direction.

9. The nonvolatile semiconductor memory device according to claim 1, further comprising a support member formed to penetrate the plurality of the conductive layers.

10. The nonvolatile semiconductor memory device according to claim 9, further comprising a plurality of support members, wherein the first contact is located between the plurality of the support members.

11. The nonvolatile semiconductor memory device according to claim 9, further comprising a second contact electrically connected to one of the plurality of the conductive layers, and a plurality of support members,
wherein the plurality of the support members are included therein, and the first contact is located between the plurality of the support members.

12. The nonvolatile semiconductor memory device according to claim 1, wherein the conductive layers comprise a metal film.

* * * * *